(12) United States Patent
Lavrich et al.

(10) Patent No.: US 11,993,131 B2
(45) Date of Patent: May 28, 2024

(54) METHODS AND SYSTEMS FOR PROVIDING FEEDBACK FOR A TRANSPORT CLIMATE CONTROL SYSTEM

(71) Applicant: THERMO KING LLC, Minneapolis, MN (US)

(72) Inventors: Philip Lewis Lavrich, Mooresville, NC (US); Casey Briscoe, Minnetonka, MN (US); Mark D. Leasure, Eagan, MN (US); Ryan Wayne Schumacher, Bloomington, MN (US); Grant A. Baumgardner, Minneapolis, MN (US); Wallace Stephen Hubbard, Chanhassen, MN (US); Panayu Robert Srichai, Minneapoli, MN (US); Matthew Srnec, Minnetonka, MN (US)

(73) Assignee: THERMO KING LLC, Minneapolis, MN (US)

( * ) Notice: Subject to any disclaimer, the term of this patent is extended or adjusted under 35 U.S.C. 154(b) by 322 days.

(21) Appl. No.: 17/420,037

(22) PCT Filed: Dec. 31, 2018

(86) PCT No.: PCT/US2018/068139
§ 371 (c)(1),
(2) Date: Jun. 30, 2021

(87) PCT Pub. No.: WO2020/142065
PCT Pub. Date: Jul. 9, 2020

(65) Prior Publication Data
US 2022/0080803 A1    Mar. 17, 2022

(51) Int. Cl.
*B60H 1/00* (2006.01)
*B60P 3/20* (2006.01)
(Continued)

(52) U.S. Cl.
CPC ..... *B60H 1/00585* (2013.01); *B60H 1/00428* (2013.01); *B60H 1/00985* (2013.01);
(Continued)

(58) Field of Classification Search
CPC .................. B60H 1/00428; B60H 1/3211; B60H 1/3205; B60L 58/10; G01C 21/3691;
(Continued)

(56) References Cited

U.S. PATENT DOCUMENTS

| 3,875,483 A | 4/1975 | Farr |
| 5,104,037 A | 4/1992 | Karg et al. |

(Continued)

FOREIGN PATENT DOCUMENTS

| CN | 2456117 | 10/2001 |
| CN | 1885660 | 12/2006 |

(Continued)

OTHER PUBLICATIONS

Yang et al., "The Role of Thermal Plume in Person-to-Person Contaminant Cross Transmission", 2017 Winter Conference, Seminar 36; Modeling and Control of the Personal Microenvironment, 5 pages.
(Continued)

*Primary Examiner* — Yuri Kan
(74) *Attorney, Agent, or Firm* — HSML P.C.

(57) ABSTRACT

Methods and systems for providing feedback for a transport climate control system are disclosed. The transport climate control system provides climate control to a climate controlled space of a transport unit. The method includes determining, by a controller, a first energy level state capable of providing power to the transport climate control system. The method also includes obtaining, by the controller, status data when a predetermined triggering event occurs. The method further includes determining, by the controller, a
(Continued)

second energy level state capable of providing power to the transport climate control system after a predetermined time interval. Also the method includes determining energy consumption data based on the first energy level state and the second energy level state. The method further includes combining the status data and the energy consumption data to obtain feedback data. The method also includes displaying, via a display device, the feedback data.

16 Claims, 8 Drawing Sheets

(51) Int. Cl.
| | |
|---|---|
| *B60R 16/033* | (2006.01) |
| *G01R 31/382* | (2019.01) |
| *G06Q 30/0207* | (2023.01) |
| *G06Q 50/06* | (2012.01) |
| *G06Q 50/28* | (2012.01) |
| *G07C 5/08* | (2006.01) |
| *G07C 5/10* | (2006.01) |

(52) U.S. Cl.
CPC ........... *G01R 31/382* (2019.01); *G06Q 50/28* (2013.01); *G07C 5/0825* (2013.01); *G07C 5/0841* (2013.01); *G07C 5/10* (2013.01); *B60P 3/20* (2013.01); *B60R 16/033* (2013.01); *G06Q 30/0239* (2013.01); *G06Q 50/06* (2013.01)

(58) Field of Classification Search
CPC ....... H04Q 9/00; B60W 10/30; G06Q 10/047; H05B 39/042; F25D 29/003; F25B 27/00
See application file for complete search history.

(56) References Cited

U.S. PATENT DOCUMENTS

| | | | |
|---|---|---|---|
| 5,231,849 A | 8/1993 | Rosenblatt | |
| 6,034,445 A | 3/2000 | Hewitt | |
| 6,064,949 A * | 5/2000 | Werner ................ | H05B 39/042 |
| | | | 702/136 |
| 6,280,320 B1 | 8/2001 | Paschke et al. | |
| 6,487,869 B1 | 12/2002 | Sulc et al. | |
| 6,518,727 B2 | 2/2003 | Oomura et al. | |
| 6,560,980 B2 | 5/2003 | Gustafson et al. | |
| 6,600,237 B1 | 7/2003 | Meissner | |
| 6,631,080 B2 | 10/2003 | Trimble et al. | |
| 6,652,330 B1 | 11/2003 | Wasilewski | |
| 6,700,214 B2 | 3/2004 | Ulinski et al. | |
| 6,753,692 B2 | 6/2004 | Toyomura et al. | |
| 6,925,826 B2 | 8/2005 | Hille et al. | |
| 7,011,902 B2 | 3/2006 | Pearson | |
| 7,120,539 B2 | 10/2006 | Krull et al. | |
| 7,122,923 B2 | 10/2006 | Lafontaine et al. | |
| 7,151,326 B2 | 12/2006 | Jordan | |
| 7,176,658 B2 | 2/2007 | Quazi et al. | |
| 7,206,692 B2 | 4/2007 | Beesley et al. | |
| 7,327,123 B2 | 2/2008 | Faberman et al. | |
| 7,424,343 B2 | 9/2008 | Kates | |
| 7,449,798 B2 | 11/2008 | Suzuki et al. | |
| 7,532,960 B2 | 5/2009 | Kumar | |
| 7,728,546 B2 | 6/2010 | Tanaka et al. | |
| 7,730,981 B2 | 6/2010 | McCabe et al. | |
| 7,745,953 B2 | 6/2010 | Puccetti et al. | |
| 7,806,796 B2 | 10/2010 | Zhu | |
| 7,830,117 B2 | 11/2010 | Ambrosio et al. | |
| 7,898,111 B1 | 3/2011 | Pistel | |
| 7,900,462 B2 | 3/2011 | Hegar et al. | |
| 8,020,651 B2 | 9/2011 | Zillmer et al. | |
| 8,030,880 B2 | 10/2011 | Alston et al. | |
| 8,134,339 B2 | 3/2012 | Burlak et al. | |
| 8,170,886 B2 | 5/2012 | Luff | |
| 8,214,141 B2 | 7/2012 | Froeberg | |
| 8,295,950 B1 | 10/2012 | Wordsworth et al. | |
| 8,381,540 B2 | 2/2013 | Alston | |
| 8,441,228 B2 | 5/2013 | Brabec | |
| 8,476,872 B2 | 7/2013 | Truckenbrod et al. | |
| 8,487,458 B2 | 7/2013 | Steele et al. | |
| 8,541,905 B2 | 9/2013 | Brabec | |
| 8,602,141 B2 | 12/2013 | Yee et al. | |
| 8,626,367 B2 | 1/2014 | Krueger et al. | |
| 8,626,419 B2 | 1/2014 | Mitchell et al. | |
| 8,643,216 B2 | 2/2014 | Lattin | |
| 8,643,217 B2 | 2/2014 | Gietzold et al. | |
| 8,670,225 B2 | 3/2014 | Nunes | |
| 8,723,344 B1 | 5/2014 | Dierickx | |
| 8,742,620 B1 | 6/2014 | Brennan et al. | |
| 8,760,115 B2 | 6/2014 | Kinser et al. | |
| 8,764,469 B2 | 7/2014 | Lamb | |
| 8,767,379 B2 | 7/2014 | Whitaker | |
| 8,818,588 B2 | 8/2014 | Ambrosio et al. | |
| 8,862,356 B2 | 10/2014 | Miller | |
| 8,912,683 B2 | 12/2014 | Dames et al. | |
| 8,924,057 B2 | 12/2014 | Kinser et al. | |
| 9,007,205 B2 * | 4/2015 | Walker ................ | F25D 29/003 |
| | | | 340/568.1 |
| 8,978,798 B2 | 5/2015 | Dalum et al. | |
| 9,030,336 B2 | 5/2015 | Doyle | |
| 9,061,680 B2 | 6/2015 | Dalum | |
| 9,093,788 B2 | 7/2015 | Lamb | |
| 9,102,241 B2 | 8/2015 | Brabec | |
| 9,147,335 B2 | 9/2015 | Raghunathan et al. | |
| 9,199,543 B2 | 12/2015 | Okamoto et al. | |
| 9,313,616 B2 | 4/2016 | Mitchell et al. | |
| 9,436,853 B1 | 9/2016 | Meyers | |
| 9,440,507 B2 | 9/2016 | Giovanardi et al. | |
| 9,463,681 B2 | 10/2016 | Olaleye et al. | |
| 9,464,839 B2 | 10/2016 | Rusignuolo et al. | |
| 9,557,100 B2 | 1/2017 | Chopko et al. | |
| 9,562,715 B2 | 2/2017 | Kundasamy | |
| 9,694,697 B2 | 7/2017 | Brabec | |
| 9,738,160 B2 | 8/2017 | Bae et al. | |
| 9,758,013 B2 | 9/2017 | Steele | |
| 9,783,024 B2 | 10/2017 | Connell et al. | |
| 9,784,780 B2 | 10/2017 | Loftus et al. | |
| 9,802,482 B2 | 10/2017 | Schumacher et al. | |
| 9,825,549 B2 | 11/2017 | Choi et al. | |
| 9,846,086 B1 | 12/2017 | Robinson et al. | |
| 9,893,545 B2 | 2/2018 | Bean | |
| 9,931,960 B2 | 4/2018 | Tabatowski-Bush et al. | |
| 9,975,403 B2 | 5/2018 | Rusignuolo et al. | |
| 9,975,446 B2 | 5/2018 | Weber et al. | |
| 9,987,906 B2 | 6/2018 | Kennedy | |
| 10,000,122 B2 | 6/2018 | Wu et al. | |
| 10,148,212 B2 | 12/2018 | Schumacher et al. | |
| 10,230,236 B2 | 3/2019 | Schumacher et al. | |
| 10,240,847 B1 | 3/2019 | Thomas, Jr. | |
| 10,427,537 B2 | 10/2019 | Symanow et al. | |
| 10,875,497 B2 | 12/2020 | Smec | |
| 10,995,760 B1 | 5/2021 | Stubbs | |
| 11,034,213 B2 | 6/2021 | Wenger et al. | |
| 2001/0025349 A1 | 9/2001 | Sharood et al. | |
| 2002/0113576 A1 | 8/2002 | Oomura et al. | |
| 2003/0043607 A1 | 3/2003 | Vinciarelli et al. | |
| 2003/0106332 A1 | 6/2003 | Okamoto et al. | |
| 2003/0200017 A1 | 10/2003 | Capps et al. | |
| 2003/0201097 A1 | 10/2003 | Zeigler et al. | |
| 2004/0168455 A1 | 9/2004 | Nakamura | |
| 2005/0057210 A1 | 3/2005 | Ueda et al. | |
| 2005/0065684 A1 | 3/2005 | Larson et al. | |
| 2005/0285445 A1 | 12/2005 | Wruck et al. | |
| 2006/0284601 A1 | 12/2006 | Salasoo et al. | |
| 2007/0052241 A1 | 3/2007 | Pacy | |
| 2007/0192116 A1 | 8/2007 | Levitt | |
| 2008/0147270 A1 | 6/2008 | Sakane et al. | |
| 2008/0177678 A1 | 7/2008 | Di Martini et al. | |
| 2008/0281473 A1 | 11/2008 | Pitt | |
| 2009/0056354 A1 * | 3/2009 | Davis ................ | B60H 1/3205 |
| | | | 62/236 |
| 2009/0121798 A1 | 5/2009 | Levinson | |
| 2009/0122901 A1 | 5/2009 | Choi et al. | |
| 2009/0126901 A1 | 5/2009 | Hegar et al. | |

(56) References Cited

U.S. PATENT DOCUMENTS

| | | |
|---|---|---|
| 2009/0178424 A1 | 7/2009 | Hwang et al. |
| 2009/0195349 A1 | 8/2009 | Frader-Thompson et al. |
| 2009/0228155 A1 | 9/2009 | Slifkin et al. |
| 2009/0229288 A1 | 9/2009 | Alston et al. |
| 2009/0314019 A1 | 12/2009 | Fujimoto et al. |
| 2009/0320515 A1 | 12/2009 | Bischofberger et al. |
| 2010/0045105 A1 | 2/2010 | Bovio et al. |
| 2010/0089669 A1 | 4/2010 | Taguch |
| 2010/0230224 A1 | 9/2010 | Hindman |
| 2010/0312425 A1 | 12/2010 | Obayashi et al. |
| 2010/0320018 A1 | 12/2010 | Gwozdek et al. |
| 2011/0000244 A1 | 1/2011 | Reason et al. |
| 2011/0114398 A1 | 5/2011 | Bianco |
| 2011/0118916 A1 | 5/2011 | Gullichsen |
| 2011/0162395 A1 | 7/2011 | Chakiachvili et al. |
| 2011/0208378 A1 | 8/2011 | Krueger et al. |
| 2011/0224841 A1 | 9/2011 | Profitt-Brown et al. |
| 2011/0241420 A1 | 10/2011 | Hering et al. |
| 2011/0265506 A1 | 11/2011 | Alston |
| 2011/0290893 A1 | 12/2011 | Steinberg |
| 2012/0000212 A1 | 1/2012 | Sanders et al. |
| 2012/0116931 A1 | 5/2012 | Meyers |
| 2012/0153722 A1 | 6/2012 | Nazarian |
| 2012/0198866 A1 | 8/2012 | Zeidner |
| 2012/0245772 A1 | 9/2012 | King |
| 2012/0310376 A1 | 12/2012 | Krumm et al. |
| 2012/0310416 A1 | 12/2012 | Tepper et al. |
| 2013/0000342 A1 | 1/2013 | Blasko et al. |
| 2013/0073094 A1 | 3/2013 | Knapton et al. |
| 2013/0088900 A1 | 4/2013 | Park |
| 2013/0158828 A1 | 6/2013 | McAlister |
| 2013/0175975 A1 | 7/2013 | Shinozaki |
| 2013/0197730 A1 | 8/2013 | Huntzicker |
| 2013/0197748 A1 | 8/2013 | Whitaker |
| 2013/0231808 A1 | 9/2013 | Flath et al. |
| 2014/0018969 A1 | 1/2014 | Forbes, Jr. |
| 2014/0020414 A1 | 1/2014 | Rusignuolo et al. |
| 2014/0026599 A1 | 1/2014 | Rusignuolo et al. |
| 2014/0060097 A1 | 3/2014 | Perreault |
| 2014/0137590 A1 | 5/2014 | Chopko et al. |
| 2014/0203760 A1 | 7/2014 | Lammers |
| 2014/0230470 A1 | 8/2014 | Cook |
| 2014/0265560 A1 | 9/2014 | Leehey et al. |
| 2014/0283533 A1 | 9/2014 | Kurtzman et al. |
| 2014/0335711 A1 | 11/2014 | Lamb |
| 2014/0343741 A1 | 11/2014 | Clarke |
| 2015/0019132 A1* | 1/2015 | Gusikhin ............ G06Q 10/047 701/400 |
| 2015/0081212 A1 | 3/2015 | Mitchell et al. |
| 2015/0121923 A1 | 5/2015 | Rusignuolo et al. |
| 2015/0168032 A1 | 6/2015 | Steele |
| 2015/0188360 A1 | 7/2015 | Doane et al. |
| 2015/0246593 A1 | 9/2015 | Larson et al. |
| 2015/0306937 A1 | 10/2015 | Kitamura et al. |
| 2015/0316301 A1 | 11/2015 | Kolda et al. |
| 2015/0344044 A1 | 12/2015 | Yuasa |
| 2015/0345958 A1* | 12/2015 | Graham ............... B60W 10/30 701/22 |
| 2015/0355288 A1 | 12/2015 | Yokoyama et al. |
| 2015/0360568 A1 | 12/2015 | Champagne et al. |
| 2016/0011001 A1 | 1/2016 | Emory et al. |
| 2016/0035152 A1 | 2/2016 | Kargupta |
| 2016/0089994 A1 | 3/2016 | Keller et al. |
| 2016/0144764 A1 | 5/2016 | Dutta et al. |
| 2016/0156258 A1 | 6/2016 | Yokoyama |
| 2016/0252289 A1 | 9/2016 | Feng et al. |
| 2016/0280040 A1 | 9/2016 | Connell et al. |
| 2016/0285416 A1 | 9/2016 | Tiwari et al. |
| 2016/0291622 A1 | 10/2016 | Al-Mohssen et al. |
| 2016/0327921 A1 | 11/2016 | Ribbich et al. |
| 2016/0377309 A1 | 12/2016 | Abiprojo et al. |
| 2017/0030728 A1 | 2/2017 | Baglino et al. |
| 2017/0057323 A1 | 3/2017 | Neu et al. |
| 2017/0063248 A1 | 3/2017 | Lee et al. |
| 2017/0082335 A1* | 3/2017 | Jin ..................... B60H 1/3232 |
| 2017/0098954 A1 | 4/2017 | Ferguson et al. |
| 2017/0107910 A1 | 4/2017 | Huang |
| 2017/0190263 A1 | 7/2017 | Enzinger et al. |
| 2017/0210194 A1 | 7/2017 | Ling |
| 2017/0217280 A1 | 8/2017 | Larson et al. |
| 2017/0219374 A1 | 8/2017 | Sitarski et al. |
| 2017/0237355 A1 | 8/2017 | Stieneker et al. |
| 2017/0259764 A1 | 9/2017 | Da Silva Carvalho et al. |
| 2017/0302200 A1 | 10/2017 | Marcinkiewicz |
| 2017/0349078 A1 | 12/2017 | Dziuba et al. |
| 2018/0022187 A1 | 1/2018 | Connell et al. |
| 2018/0029436 A1 | 2/2018 | Zaeri et al. |
| 2018/0029488 A1 | 2/2018 | Sjödin |
| 2018/0087813 A1 | 3/2018 | Senf, Jr. |
| 2018/0111441 A1 | 4/2018 | Menard et al. |
| 2018/0154723 A1 | 6/2018 | Anderson et al. |
| 2018/0170349 A1 | 6/2018 | Jobson et al. |
| 2018/0186317 A1* | 7/2018 | Srnec ........................ H02J 7/35 |
| 2018/0201092 A1 | 7/2018 | Ahuja et al. |
| 2018/0203443 A1 | 7/2018 | Newman |
| 2018/0222278 A1 | 8/2018 | Mizuma |
| 2018/0238698 A1 | 8/2018 | Pedersen |
| 2018/0306533 A1 | 10/2018 | Alahyari et al. |
| 2018/0326813 A1 | 11/2018 | Ganiere |
| 2018/0334012 A1 | 11/2018 | Geller et al. |
| 2018/0342876 A1 | 11/2018 | Agnew et al. |
| 2018/0342877 A1 | 11/2018 | Yoo et al. |
| 2018/0356870 A1 | 12/2018 | Rusignuolo et al. |
| 2019/0047496 A1 | 2/2019 | Sufrin-Disler et al. |
| 2019/0081489 A1 | 3/2019 | Gerber et al. |
| 2019/0086138 A1 | 3/2019 | Chopko et al. |
| 2019/0092122 A1 | 3/2019 | Vanous et al. |
| 2019/0123544 A1 | 4/2019 | Pelegris et al. |
| 2019/0184838 A1 | 6/2019 | Lee et al. |
| 2019/0255914 A1 | 8/2019 | Ikeda et al. |
| 2019/0277561 A1 | 9/2019 | Spath |
| 2019/0277647 A1 | 9/2019 | Adetola et al. |
| 2019/0283536 A1 | 9/2019 | Suzuki et al. |
| 2019/0283541 A1 | 9/2019 | Adetola et al. |
| 2019/0308487 A1 | 10/2019 | Badger, II et al. |
| 2020/0050753 A1 | 2/2020 | Davis et al. |
| 2020/0076029 A1 | 3/2020 | Litz |
| 2020/0086744 A1 | 3/2020 | Schumacher et al. |
| 2020/0101820 A1 | 4/2020 | Wenger et al. |
| 2020/0106271 A1 | 4/2020 | Rydkin et al. |
| 2020/0130471 A1 | 4/2020 | Leasure |
| 2020/0130473 A1 | 4/2020 | Schumacher et al. |
| 2020/0130645 A1 | 4/2020 | Smec |
| 2020/0136504 A1 | 4/2020 | Schumacher et al. |
| 2020/0141746 A1* | 5/2020 | Srnec ................. G01C 21/3691 |
| 2020/0180496 A1* | 6/2020 | Burchill ................. B60L 58/10 |
| 2020/0189361 A1 | 6/2020 | Radcliff |
| 2020/0207184 A1 | 7/2020 | Schumacher et al. |
| 2020/0231041 A1 | 7/2020 | Lavrich et al. |
| 2021/0061156 A1 | 3/2021 | Swab |
| 2021/0285780 A1* | 9/2021 | Srnec ................. G01C 21/3691 |

FOREIGN PATENT DOCUMENTS

| | | |
|---|---|---|
| CN | 2912069 | 6/2007 |
| CN | 101713577 | 5/2010 |
| CN | 202038315 | 11/2011 |
| CN | 104539184 | 4/2015 |
| CN | 104734178 | 6/2015 |
| CN | 105711376 | 6/2016 |
| CN | 106184252 | 12/2016 |
| CN | 106766419 | 5/2017 |
| CN | 108074466 | 5/2018 |
| CN | 108931006 | 12/2018 |
| CN | 208306320 | 1/2019 |
| CN | 208650989 | 3/2019 |
| DE | 3817365 | 11/1989 |
| DE | 29715576 | 12/1997 |
| DE | 10138750 | 2/2003 |
| DE | 10200637 | 10/2003 |
| DE | 102011050719 | 12/2012 |
| DE | 102014208015 | 10/2015 |
| EP | 0282051 | 9/1988 |
| EP | 1935712 | 6/2008 |

(56) References Cited

FOREIGN PATENT DOCUMENTS

| | | |
|---|---|---|
| EP | 2365915 | 9/2011 |
| EP | 2689944 | 1/2014 |
| EP | 2717016 | 9/2014 |
| EP | 2942216 | 11/2015 |
| EP | 3343728 | 7/2018 |
| EP | 2768693 | 5/2019 |
| EP | 536552 | 9/2019 |
| EP | 3540340 | 9/2019 |
| EP | 3536552 | 11/2019 |
| GB | 2551999 | 1/2018 |
| IN | 106774131 | 5/2017 |
| JP | 2000158930 | 6/2000 |
| JP | 2007320352 | 12/2007 |
| JP | 2009243780 | 10/2009 |
| JP | 5772439 | 9/2015 |
| JP | 2018-136090 | 8/2018 |
| JP | 2019145521 | 8/2019 |
| KR | 10-2012-0092834 | 8/2012 |
| SE | 541327 | 7/2019 |
| WO | 03038988 | 5/2003 |
| WO | 2008153518 | 12/2008 |
| WO | 2009155941 | 12/2009 |
| WO | 2010065476 | 6/2010 |
| WO | 2011066468 | 6/2011 |
| WO | 2011094099 | 8/2011 |
| WO | 2012138497 | 10/2012 |
| WO | 2012138500 | 10/2012 |
| WO | 2013075623 | 5/2013 |
| WO | 2013096084 | 6/2013 |
| WO | 2014002244 | 1/2014 |
| WO | 2014/058610 | 4/2014 |
| WO | 2014085672 | 6/2014 |
| WO | 2014106060 | 7/2014 |
| WO | 2014106068 | 7/2014 |
| WO | 2016038838 | 3/2016 |
| WO | 2016145107 | 9/2016 |
| WO | 2017058660 | 4/2017 |
| WO | 2017/083336 | 5/2017 |
| WO | 2017083333 | 5/2017 |
| WO | 2017151698 | 9/2017 |
| WO | 2017/172855 | 10/2017 |
| WO | 2017172484 | 10/2017 |
| WO | 2017176682 | 10/2017 |
| WO | 2017176725 | 10/2017 |
| WO | 2017176729 | 10/2017 |
| WO | 2017189485 | 11/2017 |
| WO | 2017218909 | 12/2017 |
| WO | 2017218910 | 12/2017 |
| WO | 2017218912 | 12/2017 |
| WO | 2018/009798 | 1/2018 |
| WO | 2018/017450 | 1/2018 |
| WO | 2018005957 | 1/2018 |
| WO | 2018009646 | 1/2018 |
| WO | 2018017818 | 1/2018 |
| WO | 2018029502 | 2/2018 |
| WO | 2018/204591 | 11/2018 |
| WO | 2018204591 | 11/2018 |
| WO | 2018226389 | 12/2018 |
| WO | 2018226649 | 12/2018 |
| WO | 2018226848 | 12/2018 |
| WO | 2018226857 | 12/2018 |
| WO | 2018226862 | 12/2018 |
| WO | 2018226906 | 12/2018 |
| WO | 2018226981 | 12/2018 |
| WO | 2018226986 | 12/2018 |
| WO | 2019051086 | 3/2019 |
| WO | 2019151947 | 8/2019 |
| WO | 2020068446 | 4/2020 |
| WO | 2020068450 | 4/2020 |
| WO | 2020068469 | 4/2020 |
| WO | 2020068475 | 4/2020 |
| WO | 2020068502 | 4/2020 |
| WO | 2020068556 | 4/2020 |
| WO | 2020068641 | 4/2020 |
| WO | 2020068646 | 4/2020 |
| WO | 2020069107 | 4/2020 |

OTHER PUBLICATIONS

"Lamberet Smart Reefer on Solutrans", ZOEKEN, Jul. 28, 2015, 7 pages, available at: https:/iepieleaks.nl/lamberet-smart-reefer-solutrans/.

U.S. Appl. No. 16/178,067, titled "Methods and Systems for Generation and Utilization of Supplemental Stored Energy for Use in Transport Climate Control", filed Nov. 1, 2018, 35 pages.

U.S. Appl. No. 16/565,063, titled "System and Method for Managing Power and Efficiently Sourcing a Variable Voltage for a Transport Climate Control System", filed Sep. 9, 2019, 59 pages.

U.S. Appl. No. 16/730,126, titled "Transport Climate Control System Power Architecture", filed Dec. 30, 2019, 27 pages.

U.S. Appl. No. 16/574,754, titled "Methods and Systems for Energy Management of a Transport Climate Control System", filed Sep. 18, 2019, 50 pages.

European Patent Application No. 18382672.6, titled "Methods and Systems for Energy Management of a Transport Climate Control System", filed Sep. 19, 2018, 50 pages.

European Patent Application No. 18382673.4 titled "Methods and Systems for Power and Load Management of a Transport Climate Control System", filed Sep. 19, 2018, 68 pages.

U.S. Appl. No. 16/176,802, titled "Methods and Systems for Controlling a Mild Hybrid System That Powers a Transport Climate Control System", filed Oct. 31, 2018, 31 pages.

U.S. Appl. No. 16/236,938, titled "Systems and Methods for Smart Load Shedding of a Transport Vehicle While in Transit", filed Dec. 31, 2018, 39 pages.

U.S. Appl. No. 16/176,720, titled "Methods and Systems for Augmenting a Vehicle Powered Transport Climate Control System", filed Oct. 31, 2018, 41 pages.

U.S. Appl. No. 16/176,602, titled "Reconfigurable Utility Power Input With Passive Voltage Booster", filed Oct. 31, 2018, 39 pages.

U.S. Appl. No. 16/147,704, titled "Methods and Systems for Monitoring and Displaying Energy Use and Energy Cost of a Transport Vehicle Climate Control System or a Fleet of Transport Vehicle Climate Control Systems", filed Sep. 29, 2018, 33 pages.

U.S. Appl. No. 16/235,865, titled "Methods and Systems for Preserving Autonomous Operation of a Transport Climate Control System", filed Dec. 28, 2018, 41 pages.

U.S. Appl. No. 16/574,775, titled "Methods and Systems for Power and Load Management of a Transport Climate Control System", filed Sep. 18, 2019, 68 pages.

U.S. Appl. No. 17/420,022, titled "Methods and Systems for Providing Predictive Energy Consumption Feedback for Powering a Transport Climate Control System", filed Jun. 30, 2021, 34 pages.

U.S. Appl. No. 17/420,032, titled "Methods and Systems for Notifying and Mitigating a Suboptimal Event Occurring in a Transport Climate Control System", filed Jun. 30, 2021, 44 pages.

U.S. Appl. No. 17/420,043, titled "Methods and Systems for Providing Predictive Energy Consumption Feedback for Powering a Transport Climate Control System Using External Data", filed Jun. 30, 2021, 39 pages.

U.S. Appl. No. 16/911,692, titled "Climate Controlled Vehicle, Transport Climate Control Equipment, Method of Retrofitting a Vehicle and Method of Operation", filed Jun. 25, 2020, 39 pages.

U.S. Appl. No. 16/565,110, titled "Transport Climate Control System With a Self-Configuring Matrix Power Converter", filed Sep. 9, 2019, 52 pages.

U.S. Appl. No. 16/565,146, titled "Optimized Power Management for a Transport Climate Control Energy Source", filed Sep. 9, 2019, 53 pages.

U.S. Appl. No. 62/897,833, titled "Optimized Power Distribution to Transport Climate Control Systems Amongst One or More Electric Supply Equipment Stations", filed Sep. 9, 2019, 41 pages.

European Patent Application No. 19382776.3, titled "Mprioritized Power Delivery for Facilitating Transport Climate Control", filed Sep. 9, 2019, 41 pages.

(56) References Cited

OTHER PUBLICATIONS

U.S. Appl. No. 16/565,282, titled "Optimized Power Cord for Transferring Power to a Transport Climate Control System", filed Sep. 9, 2019, 43 pages.
U.S. Appl. No. 16/565,235, titled "Interface System for Connecting a Vehicle and a Transport Climate Control System", filed Sep. 9, 2019, 64 pages.
U.S. Appl. No. 16/565,205, titled "Transport Climate Control System With an Accessory Power Distribution Unit for Managing Transport Climate Control Loads", filed Sep. 9, 2019, 57 pages.
U.S. Appl. No. 17/015,190, titled "Optimized Power Distribution to Transport Climate Control Systems Amongst One or More Electric Supply Equipment Stations", filed Sep. 9, 2020, 43 pages.
U.S. Appl. No. 16/147,708, titled "Methods and Systems for Autonomous Climate Control Optimization of a Transport Vehicle", filed Sep. 29, 2018, 41 pages.
U.S. Appl. No. 16/176,667, titled "Drive off Protection System and Method for Preventing Drive off", filed Oct. 31, 2018, 41 pages.
U.S. Appl. No. 16/565,252, titled "Demand-Side Power Distribution Management for a Plurality of Transport Climate Control Systems", filed Sep. 9, 2019, 44 pages.
U.S. Appl. No. 17/015,194, titled "Prioritized Power Delivery for Facilitating Transport Climate Control", filed Sep. 9, 2020, 41 pages.
International Search Report and Written Opinion, issued in the PCT International Patent Application No. PCT/US2018/068139, dated Aug. 21, 2019, 14 pages.

\* cited by examiner

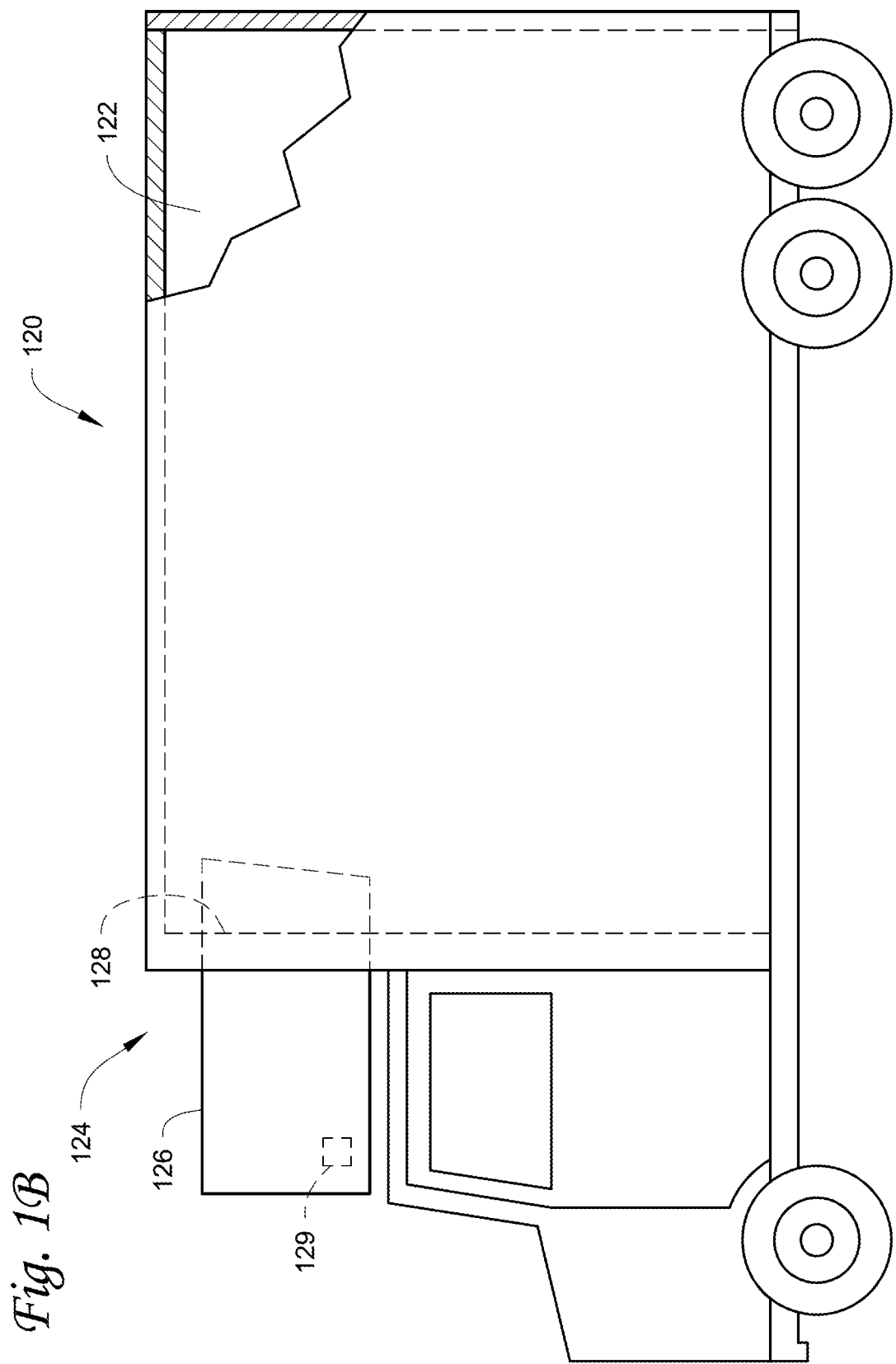

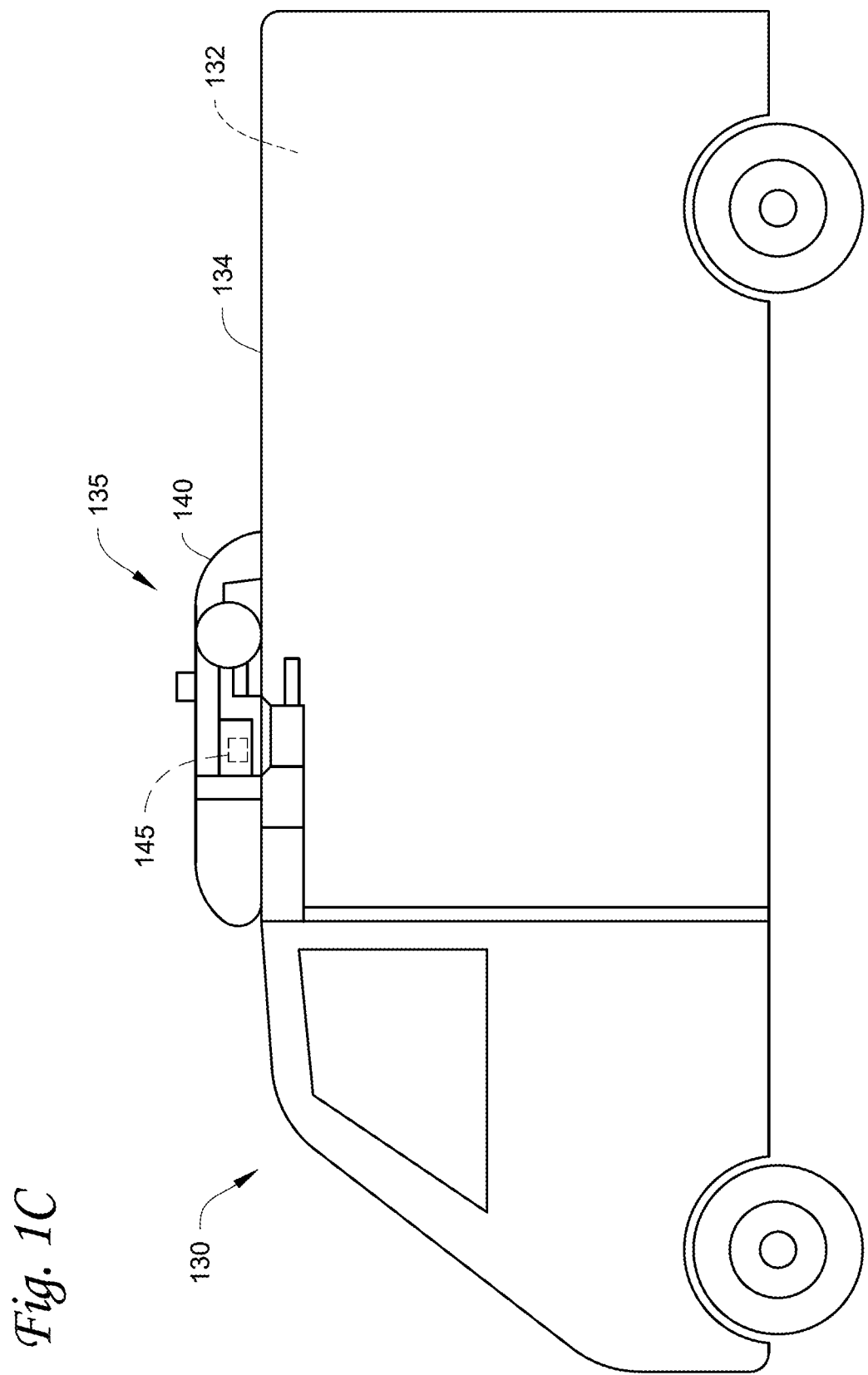

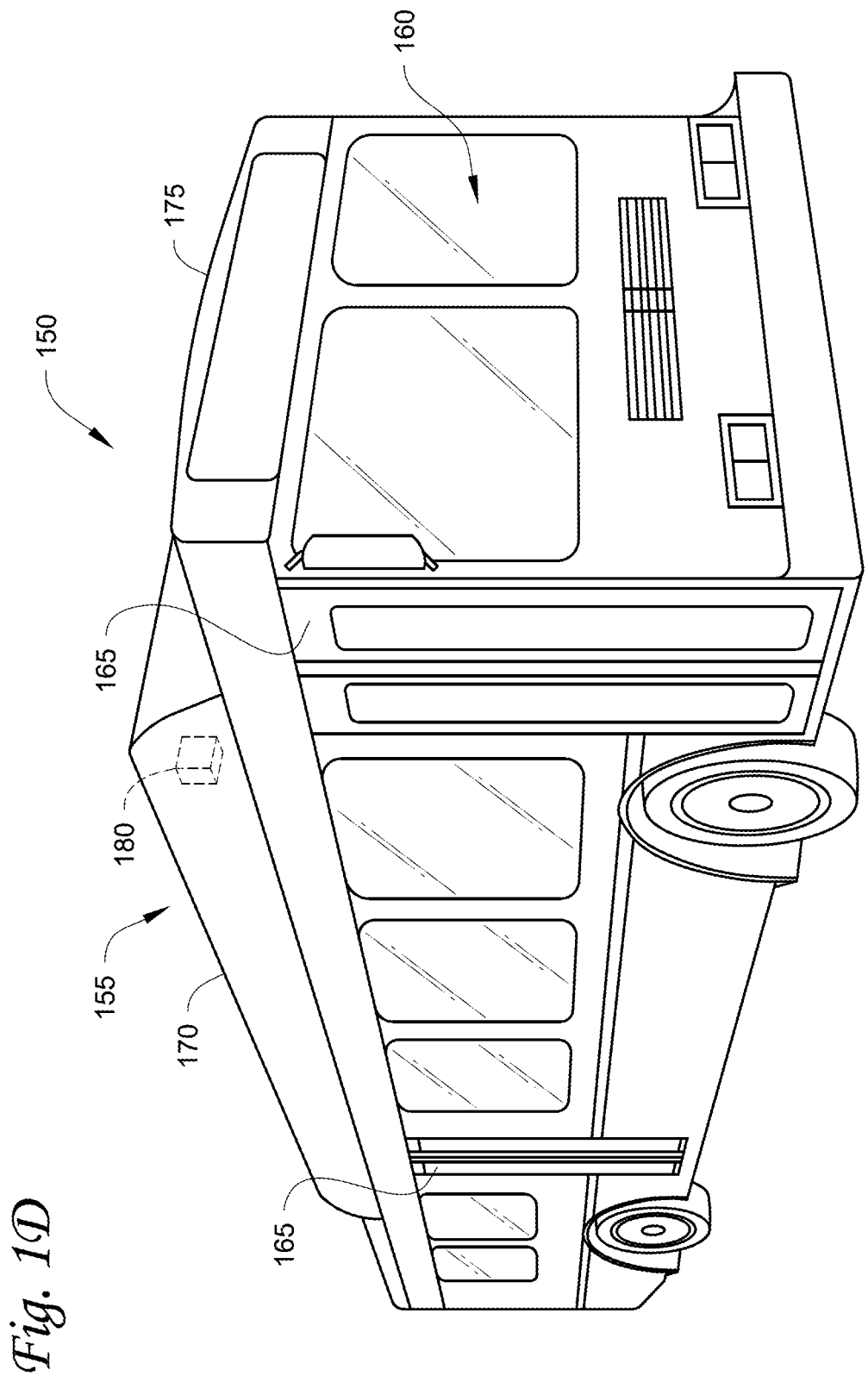

METHODS AND SYSTEMS FOR PROVIDING FEEDBACK FOR A TRANSPORT CLIMATE CONTROL SYSTEM

FIELD

This disclosure relates generally to a climate control system for a transport unit. More specifically, the disclosure relates to methods and systems for providing feedback on energy consumption for a transport climate control system.

BACKGROUND

A transport climate control system can include, for example, a transport refrigeration system (TRS) and/or a heating, ventilation and air conditioning (HVAC) system. A TRS is generally used to control an environmental condition (e.g., temperature, humidity, air quality, and the like) within a cargo space of a transport unit (e.g., a truck, a container (such as a container on a flat car, an intermodal container, etc.), a box car, a semi-tractor, a bus, or other similar transport unit). The TRS can maintain environmental condition(s) of the cargo space to maintain cargo (e.g., produce, frozen foods, pharmaceuticals, etc.). In some embodiments, the transport unit can include a HVAC system to control a climate within a passenger space of the vehicle.

SUMMARY

This disclosure relates generally to a climate control system for a transport unit. More specifically, the disclosure relates to methods and systems for providing feedback on energy consumption for a transport climate control system.

It will be appreciated that transport climate control systems are trending toward more use of electrification. Typically, effective power management and route planning can be important for electrified systems because battery recharging can require significant downtime and because providing excessive battery capacity can be expensive. A transport climate control system can provide climate control to a climate controlled space of a transport unit. The power consumption of a transport climate control system can be affected by a number of factors including, for example, door openings (to the climate controlled space) and other driver/operator behaviors, controller settings, ambient conditions, cargo condition (e.g., whether a precooled desired setpoint is matched or not (e.g., hot load/cargo)), etc. Drivers and operators may have limited insight into the effect of these factors on the total energy usage of the transport climate control system. In other words, drivers and operators have limited insight into the factors that can affect the performance of a transport climate control system, including the ability to successfully complete a planned route. This issue can be particularly relevant for electrified transport climate control systems, in which battery capacity may be limited and cannot be easily replenished. It will be appreciated that although some embodiments are framed around electrified systems, these embodiments can apply to diesel-powered systems, systems powered by other energy sources, or auxiliary power units (e.g., auxiliary power units for trailer power such as a genset on a trailer for refrigeration), etc.

In one embodiment, a method for providing feedback for a transport climate control system is disclosed. The transport climate control system provides climate control to a climate controlled space of a transport unit. The method includes determining, by a controller, a first energy level state capable of providing power to the transport climate control system. The method also includes obtaining, by the controller, status data when a predetermined triggering event occurs. The method further includes determining, by the controller, a second energy level state capable of providing power to the transport climate control system after a predetermined time interval. Also the method includes determining energy consumption data based on the first energy level state and the second energy level state. The method further includes combining the status data and the energy consumption data to obtain feedback data. The method also includes displaying, via a display device, the feedback data. It will be appreciated that more energy level states can be determined and the energy level states can be combined, by the controller, to obtain a profile (e.g., energy consumption data). It will also be appreciated that the controller (or computational engine) can be a lookup table, a simplified (e.g., predetermined) model, or a complex (e.g., predetermined) model. It will further be appreciated that any runtime variables can be taken when comparing with a predetermined model to predict future operation.

In one embodiment, a transport climate control system for use in a vehicle is disclosed. The system includes a climate control circuit including a compressor configured to provide climate control to a climate controlled space of a transport unit. The system also includes a display device. The system further includes a controller connected to the display device. The controller is configured to determine a first energy level state capable of providing power to the climate control circuit. The controller is also configured to obtain status data when a predetermined triggering event occurs. The controller is further configured to determine a second energy level state capable of providing power to the climate control circuit after a predetermined time interval. Also the controller is configured to determine energy consumption data based on the first energy level state and the second energy level state. The controller is further configured to combine the status data and the energy consumption data to obtain feedback data. The display device is configured to display the feedback data.

Embodiments disclosed herein can provide drivers/operators a means to forecast their ability to complete a trip in progress or assess how to complete future trips more efficiently. Embodiments disclosed herein can also provide users (e.g., customer, dispatch user, fleet manager, logistics user, yard worker, etc.) insight into driver/operator behaviors to assess and enforce potential improvements to their operations.

Embodiments disclosed herein can also provide a user the capability to provide feedback on a driver or operator's behavior upon completion of a delivery route or at some other time/distance interval as desired by the user. It will be appreciated that feedback can be provided via a number of different mechanisms, e.g. directly through a transport climate control system controller HMI (Human Machine Interface), a telematics unit, a smart phone application, a website, etc. Examples of feedback can include energy consumption over the duration of the route, door opening events, and the impact of other external factors on the overall route performance. The feedback can be provided to, e.g., the driver of the vehicle, the customer, a dispatch user, a fleet manager, a logistics user, a yard worker, or others. Embodiments disclosed herein can also provide prognostics on the quality of a given route, the need for intervention in case the stored energy is depleted, route optimization, etc.

Embodiments disclosed herein can further help operators assess/reduce energy (e.g., power, fuel, etc.) usage in their routes and/or help them determine whether the transport unit is likely to run out of energy before the end of a current trip. For auxiliary power units (e.g., auxiliary power units for trailer power such as a genset on a trailer for refrigeration) and/or bus systems, embodiments disclosed herein can help assess whether the available battery or fuel supply is sufficient given the power usage history and stop time.

Also embodiments disclosed herein can monitor and optimize energy usage, and provide relevant feedback to drivers and/or operators on the performance of their transport units and the impact of various factors on the performance of their routes. It will be appreciated that usage of the embodiments disclosed herein for post-trip or aggregated trip history informatics can help incentivizing proper operation of a limited energy climate control unit.

Other features and aspects will become apparent by consideration of the following detailed description and accompanying drawings.

BRIEF DESCRIPTION OF THE DRAWINGS

References are made to the accompanying drawings that form a part of this disclosure and which illustrate the embodiments in which systems and methods described in this specification can be practiced.

FIG. 1B illustrates a side view of a truck with a transport climate control system, according to one embodiment.

FIG. 1C illustrates a side view of a van with a transport climate control system, according to one embodiment.

FIG. 1D illustrates a perspective view of a passenger vehicle including a transport climate control system, according to one embodiment.

Like reference numbers represent like parts throughout.

DETAILED DESCRIPTION

This disclosure relates generally to a climate control system for a transport unit. More specifically, the disclosure relates to methods and systems for providing feedback on energy consumption for a transport climate control system.

Embodiments disclosed herein can provide feedback to drivers and/or operators on the performance of the transport climate control system and the impact of various factors on the performance of the routes. It will be appreciated that the term "performance" can refer to, for example, overall energy usage, equipment run time, temperature control, other objectives, or the combination thereof.

Figure 1A:
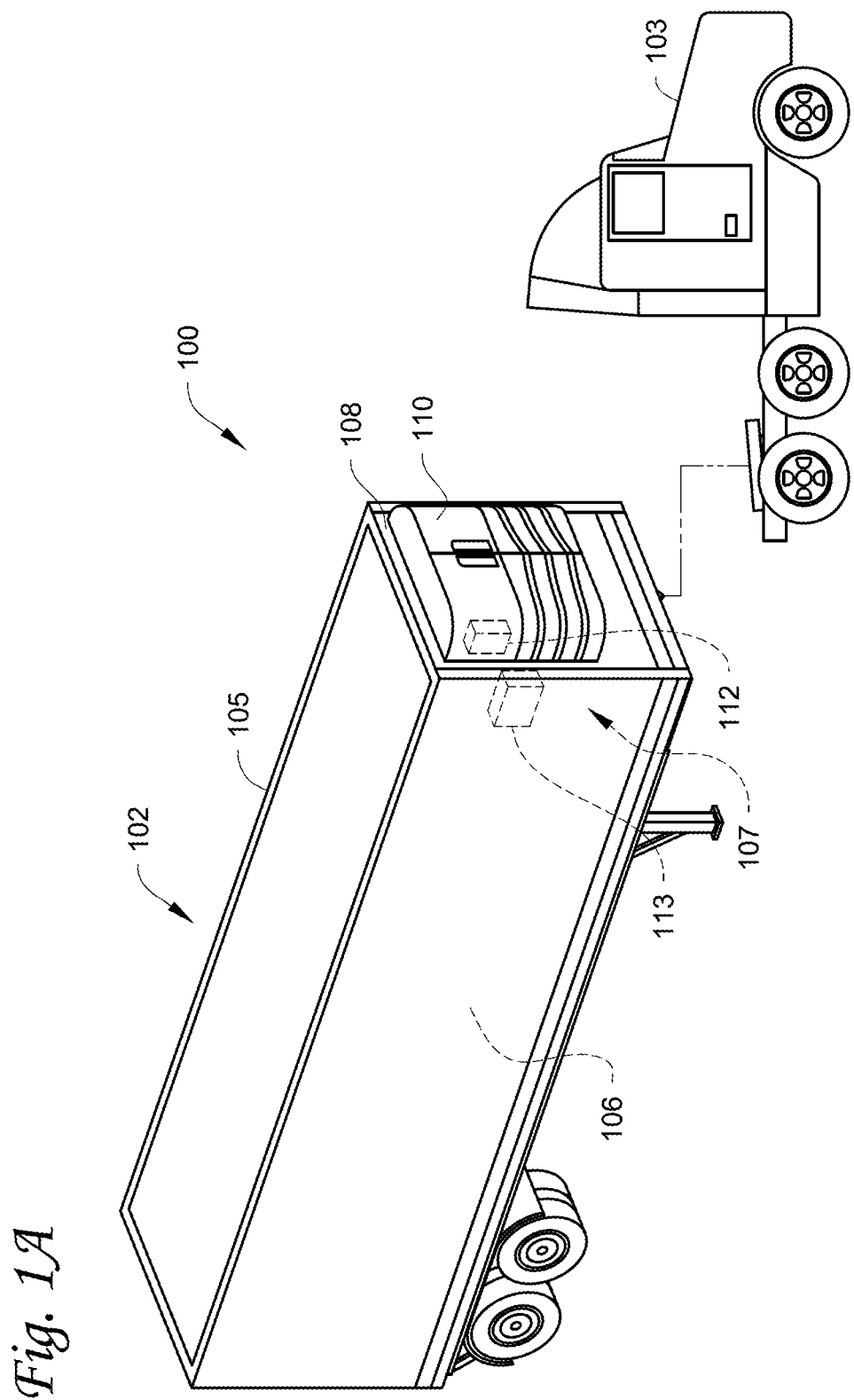
FIG. 1A illustrates a perspective view of a climate controlled transport unit with a transport climate control system attached to a tractor, according to one embodiment.

FIG. 1A illustrates one embodiment of a climate controlled transport unit 102 attached to a tractor 103. The climate controlled transport unit 102 includes a transport climate control system 100 for a transport unit 105. The tractor 103 is attached to and is configured to tow the transport unit 105. The transport unit 105 shown in FIG. 1A is a trailer. It will be appreciated that the embodiments described herein are not limited to tractor and trailer units, but can apply to any type of transport unit (e.g., a truck, a container (such as a container on a flat car, an intermodal container, a marine container, etc.), a box car, a semi-tractor, a bus, or other similar transport unit), etc.

The transport climate control system 100 includes a climate control unit (CCU) 110 that provides environmental control (e.g. temperature, humidity, air quality, etc.) within a climate controlled space 106 of the transport unit 105. The transport climate control system 100 also includes a programmable climate controller 107 and one or more sensors (not shown) that are configured to measure one or more climate control parameters of the transport climate control system 100 (e.g., an ambient temperature outside of the transport unit 105, a space temperature within the climate controlled space 106, an ambient humidity outside of the transport unit 105, a space humidity within the climate controlled space 106, a door opening event of the transport unit 105, etc.) and communicate climate control parameter data to the climate controller 107.

The CCU 110 is disposed on a front wall 108 of the transport unit 105. In other embodiments, it will be appreciated that the CCU 110 can be disposed, for example, on a rooftop or another wall of the transport unit 105. The CCU 110 includes a transport climate control circuit (see FIG. 2) that connects, for example, a compressor, a condenser, an evaporator and an expansion valve to provide conditioned air within the climate controlled space 106.

The climate controller 107 may comprise a single integrated control unit 112 or may comprise a distributed network of climate controller elements 112, 113. The number of distributed control elements in a given network can depend upon the particular application of the principles described herein. The climate controller 107 is configured to control operation of the transport climate control system 100 including the transport climate control circuit.

FIG. 1B depicts a temperature-controlled straight truck 120 that includes a climate controlled space 122 for carrying cargo and a transport climate control system 124. The transport climate control system 124 includes a CCU 126 that is mounted to a front wall 128 of the load space 112. It will be appreciated that the CCU 126 can be mounted to any other suitable locations. The CCU 126 is controlled via a climate controller 129 to provide climate control within the climate controlled space 122. The CCU 126 can include, amongst other components, a transport climate control circuit (see FIG. 2) that connects, for example, a compressor, a condenser, an evaporator and an expansion valve to provide climate control within the climate controlled space 122.

The transport climate control system 124 also includes a programmable climate controller 129 and one or more sensors (not shown) that are configured to measure one or more climate control parameters of the transport climate control system 124 (e.g., an ambient temperature outside of the truck 120, a space temperature within the climate controlled space 122, an ambient humidity outside of the truck 120, a space humidity within the climate controlled space 122, a door opening event of the truck 120, etc.) and communicate climate control parameter data to the climate controller 129. The climate controller 129 is configured to control operation of the transport climate control system 124 including the transport climate control circuit.

FIG. 1C depicts a temperature-controlled van 130 that includes a climate controlled space 132 for carrying cargo and a transport climate control system 135 for providing climate control within the climate controlled space 132. The transport climate control system 135 includes a CCU 140 that is mounted to a rooftop 134 of the climate controlled space 132. The transport climate control system 135 can include, amongst other components, a transport climate control circuit (see FIG. 2) that connects, for example, a compressor, a condenser, an evaporator and an expansion valve to provide climate control within the climate controlled space 132.

The transport climate control system 135 also includes a programmable climate controller 145 and one or more sensors (not shown) that are configured to measure one or more climate control parameters of the transport climate control system 135 (e.g., an ambient temperature outside of the van 130, a space temperature within the climate controlled space 132, an ambient humidity outside of the van 130, a space humidity within the climate controlled space 132, a door opening event of the van 130, etc.) and communicate climate control parameter data to the climate controller 130. The climate controller 130 is configured to control operation of the transport climate control system 135 including the transport climate control circuit.

FIG. 1D is a perspective view of a vehicle 150 including a transport climate control system 155, according to one embodiment. The vehicle 150 is a mass-transit bus that can carry passenger(s) (not shown) to one or more destinations. In other embodiments, the vehicle 150 can be a school bus, railway vehicle, subway car, or other commercial vehicle that carries passengers. The vehicle 150 includes a climate controlled space (e.g., passenger compartment) 160 supported that can accommodate a plurality of passengers. The vehicle 150 includes doors 165 that are positioned on a side of the vehicle 150. In the embodiment shown in FIG. 1D, a first door 165 is located adjacent to a forward end of the vehicle 150, and a second door 165 is positioned towards a rearward end of the vehicle 150. Each door 165 is movable between an open position and a closed position to selectively allow access to the climate controlled space 160. The transport climate control system 155 includes a CCU 170 attached to a roof 175 of the vehicle 150.

The CCU 170 includes a transport climate control circuit (not shown) that connects, for example, a compressor, a condenser, an evaporator and an expansion device to provide conditioned air within the climate controlled space 160. The transport climate control system 155 also includes a programmable climate controller 180 and one or more sensors (not shown) that are configured to measure one or more climate control parameters of the transport climate control system 155 (e.g., an ambient temperature outside of the vehicle 150, a space temperature within the climate controlled space 160, an ambient humidity outside of the vehicle 150, a space humidity within the climate controlled space 160, a door opening event of one or more of the doors 165 of the vehicle 150, etc.) and communicate climate control parameter data to the climate controller 180. The climate controller 180 may comprise a single integrated control unit or may comprise a distributed network of climate controller elements. The number of distributed control elements in a given network can depend upon the particular application of the principles described herein. The climate controller 180 is configured to control operation of the transport climate control system 155 including the HVAC circuit.

Figure 2:
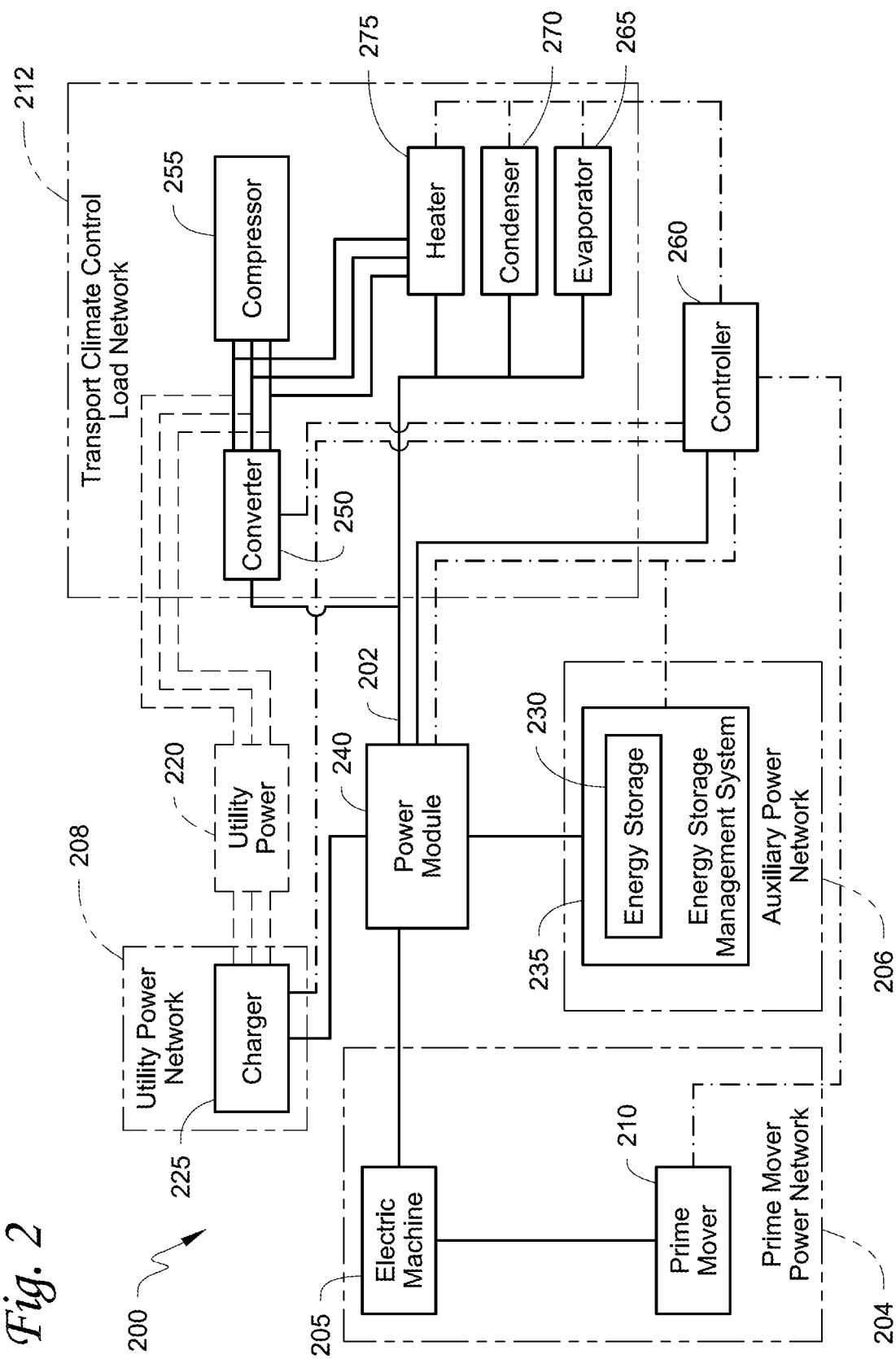
FIG. 2 illustrates a block diagram schematic of one embodiment of a power system for powering a transport climate control system, according to one embodiment.

FIG. 2 illustrates a block diagram schematic of one embodiment of a power system 200 for powering a transport climate control system. The power system 200 can power the transport climate control systems 100, 124, 135, 155 shown in FIGS. 1A-1D. The power system 200 includes a prime mover power network 204, an auxiliary power network 206, a utility power network 208, and a transport climate control load network 212 connected to a power conversion module 240. It will be appreciated that in some embodiments, the power system 200 can include one or more of the prime mover power network 204, the auxiliary power network 206, and/or the utility power network 208. For example, in one embodiment, the power system 200 only includes the prime mover power network 204, without the auxiliary power network 206 and/or the utility power network 208. In another embodiment, the power system 200 includes the prime mover power network 204 and the utility power network 208, without the auxiliary power network 206. The power system 200 can use one or more of the prime mover power network 204, the auxiliary power network 206 and the utility power network 208 at any given time to provide power to the transport climate control load network 212. While the power system 200 is configured to be a hybrid power system that is powered by the prime mover power network 204 in combination with the auxiliary power network 206 and/or the utility power network 208. However, it will be appreciated that the embodiments described herein can be used with a fully electric power system that does not include a prime mover or prime mover power network to provide power to the transport climate control system.

The prime mover power network 204 includes a prime mover 210 and an electric machine 205 that can provide electric power to the power conversion module 240. The prime mover 210 is configured to generate mechanical power and the electric machine 210 is configured to convert the mechanical power to electric power. The generated electric power is then sent by the prime mover power network 205 to the power conversion module 240. In some embodiments, the prime mover 210 can be a vehicle prime mover used to move the vehicle that also provides power to the transport climate control load network 212 when available. It will be appreciated that in these embodiments, mechanical power generated by the prime mover 210 that can be used in the system 200 can be inconsistent and based on operation and vehicle load requirements of the vehicle. In other embodiments, the prime mover 210 and the electric machine 205 can be part of a generator set that provides power to the transport climate control load network 212. In yet some other embodiments, the prime mover 210 and the electric machine 205 can be part of a CCU (e.g., the CCU 110, 126, 140, 170 shown in FIGS. 1A-D) to provide power to the transport climate control load network 212. It will be appreciated that in some embodiments the maximum power available from the prime mover power network 204 may never be sufficient to operate the transport climate control system operating at a full capacity.

In some embodiments, the electric machine 205 can be an electrical generator that can provide DC power to the transport climate control load network 212. In some embodiments, the electric machine 205 can include an alternator and a rectifier or an AC-DC converter (not shown) that rectifies or converts the AC power generated by the electric machine 205 to a DC power.

It will be appreciated that when the vehicle is an electric vehicle, there may be no prime mover 210. The electric machine 205 can be a motor generator that is used with a high voltage (e.g., in a range between 60V and 1500V; for example 400V, 800V, etc.) DC battery to run the vehicle. Electric vehicles can also provide a relatively high voltage (e.g., 400V, 800V, etc.) DC power source (e.g., a battery pack, a rechargeable energy storage system (RESS), etc.). Electric vehicles can include one or more DC-DC converters (e.g., two DC-DC convertors) to convert the relatively high voltage (e.g., 400V, 800V, etc.) to a low voltage (e.g., in a range between 0V and 60V; for example 12V). That is, the electric machine 205 can be replaced with a DC-DC converter having similar parameters as the electric machine 205 in order to be able to provide prime mover network power to the power conversion module 240.

In some embodiments, the electric machine 205 can provide a low voltage (e.g. 12V) from the prime mover power network 204 to the power conversion module 240 for powering the transport climate control load network 212. In some embodiments, an electric vehicle can provide for example, 7 kW-Hour energy from a 45 kW-Hour storage of the prime mover power network 204 to the power conversion module 240 to run the transport climate control load network 212. In some embodiments, the prime mover power network 204 can use take off power (e.g., electric power take off or ePTO) from the low voltage (for example, 12V) system for loads such as the power conversion module 240. The high voltage power can provide power for driving the vehicle (e.g., transmission power take off) and the power system 200 but may not take electric power from the high voltage system.

It will be appreciated that in a hybrid vehicle, there may be a machine (such as the electric machine 205) and/or a low voltage DC power source that can provide a low voltage (e.g., 12V) to the power conversion module 240.

It will be appreciated that any type of power source can provide power to the power system 200 and can be part of the prime mover power network 204. This can include, for example, the electric machine 205, a battery, a RESS, a generator, an axle-mounted generator, a power take off (PTO) device or ePTO device with an auxiliary converter, etc.

The auxiliary power network 206 includes an energy storage source 230 and an energy storage management system 235. In some embodiments, the auxiliary power network 206 can be part of the transport climate control system and potentially housed within a CCU. In other embodiments, the auxiliary power network 206 can be external to the transport climate control system and part of the prime mover power network 204. In yet some other embodiments, the auxiliary power network 206 can be external to the transport climate control system and external to the prime mover power network 204.

In some embodiments, the energy storage source 230 can include one or more batteries. For example, in one embodiment the energy storage source 230 can include two batteries (not shown). Each of the batteries can also be connected to the power conversion module 240. It will be appreciated that the energy storage source 230 can provide sufficient energy to power the transport climate control load network 212 by itself. In some embodiments, the energy storage source 230 can provide 12 VDC or 24 VDC. In other embodiments, the energy storage source 230 can provide 48 VDC.

The energy storage management system 235 is configured to monitor a charge level of one or more batteries of the energy storage source 230 and charge the one or more batteries of the energy storage source 230. The energy storage management system 235 can communicate with, for example, the controller 260 and/or a controller (not shown) of the power conversion module 240 to provide a charge level of one or more batteries of the energy storage source 230. Also, the energy storage management system 235 can receive instructions from, for example, the controller 260 and/or the controller of the power conversion module 240 indicating the amount of power from the energy storage source 230 should be supplied to the power conversion module 240.

It will be appreciated that in other embodiments, the energy storage management system 235 can be configured to monitor other parameters (e.g., monitor the fuel levels for an engine-driven system) and communicate the monitored data with, for example, the controller 260 and/or a controller (not shown) of the power conversion module 240.

The power conversion module 240 is configured to convert a power from both of the prime mover power network 204 and the auxiliary power network 206 to a load power compatible with one or more loads of the transport climate control load network 212. That is, the power conversion module 240 is configured to buck or boost power from the prime mover power network 204 and is configured to buck or boost power from the auxiliary power network 206 to obtain the desired load power. In some embodiments, the power conversion module 240 can include one or more DC/DC converters. For example, the power conversion module 240 can include one DC/DC converter to convert the power generated by the prime mover power network 204 and/or the auxiliary power network 206 to a voltage compatible with one or more loads of the transport climate control load network 212 and a second DC/DC converter to convert the auxiliary network power to a voltage compatible with one or more loads of the transport climate control load network 212. The converted power from the prime mover power network 204 and the converted power from the auxiliary power network 206 are combined to obtain a load power compatible with one or more loads of the transport climate control load network 212. The load power outputted by the power conversion module 240 can then be provided on a load DC bus 202 to the transport climate control load network 212. In some embodiments, the load power can be a low voltage DC power (e.g., between 0-60V DC). In other embodiments, the load power can be a high voltage DC power (e.g., between 60-1500V DC).

In some embodiments, the power conversion module 240 can include a controller (not shown) configured to monitor and control the power conversion module 240. In some embodiments, the controller can communicate with the controller 260.

The power system 200, and particularly the power conversion module 240, is controlled by the controller 260 of the transport climate control load network 212. The controller 260 can be, for example, the controller 107, 129, 130 and 180 shown in FIGS. 1A-D. In some embodiments, the power conversion module 240 can monitor the amount of current and/or voltage provided by the prime mover power network 204. Also, in some embodiments, the power conversion module 240 can monitor the amount of current and/or voltage drawn by components of the transport climate control load network 212. The power conversion module 240 can be configured to communicate the amount of current and/or voltage provided by the prime mover power network 204 and the amount of current and/or voltage drawn by components of the transport climate control load network 212.

Components of the transport climate control load network 212 can be, for example, part of a CCU that is mounted to the body of the vehicle (for example, truck, van, etc.). In some embodiments, the CCU can be above the cab of the truck (as shown in FIG. 1A). In another embodiment, the CCU can be on the top of the TU (for example, a top of a box where the external condensers are located) (see FIG. 1B). In some embodiments, the components of the transport climate control load network 212 can be DC powered components. In some embodiments, the components of the transport climate control load network 212 can be AC powered components. In some embodiments, the transport climate control load network 212 can include both DC powered components and AC powered components.

As shown in FIG. 2, the transport climate control load network 212 includes at least one compressor 255, one or more evaporator blowers 265, one or more condenser fans 270, the heater 275, and the controller 260. It will be appreciated that in some embodiments, the transport climate control load network 212 does not include the heater 275. It will also be appreciated that in some embodiments, the transport climate control load network 212 does not include the at least one compressor 255. It will further be appreciated that in some embodiments, the transport climate control load network 212 can include thermal management of batteries, power electronics, etc. The transport climate control load network 212 also includes an inverter 250 that is configured to boost the load power and convert the boosted load power to an AC load power. That is, the inverter 250 is configured to boost power from the DC load bus 202 and converts the power to AC power to drive the compressor 255. In some embodiments, the inverter 250 can convert the load power to a high voltage AC power. As shown in FIG. 2, the inverter 250 is configured to power the compressor 255 and optionally the heater 275. It will be appreciated that in other embodiments, the inverter 250 can power other components of the transport climate control load network 212 such as, for example, the one or more evaporator blowers 265, the one or more condenser fans 270, etc. In some embodiments, the inverter 250 can be a Compressor Drive Module (CDM).

In some embodiments, the inverter 250 can convert low voltage DC power (for example, 12 VDC, 24 VDC, 48 VDC) from the load DC bus 202 and provide AC power (for example, 230 VAC three phase, 460 VAC three phase, etc.) to drive the compressor 255. In particular, the inverter 250 drives the compressor 255 to meet demand of the transport climate control system.

The load DC bus 202 is connected to and powers each of the inverter 250, the one or more evaporator blowers 265, the one or more condenser fans 270, the heater 275, and the controller 260. It will be appreciated that the inverter 250 with the compressor 255 can require the most power of the various loads of the transport climate control load network 212. As shown in FIG. 2, in some embodiments, the inverter 250 can also power the heater 275.

The utility power network 208 is configured to charge the energy storage source 230 of the auxiliary power network 206 when, for example, the vehicle is parked and has access to a utility power source 220. In some embodiments, the utility power network 208 can also provide power to operate the transport climate control load network 212 when, for example, the vehicle is parked and has access to a utility power source. The utility power network 208 includes the AC-DC converter 225. The utility power source (e.g., shore power, etc.) 220 can be connected to the AC-DC converter 225 to provide AC power input to the AC-DC converter 225. The AC-DC converter 225 is configured to convert the AC power from the utility power source 220 and to provide converted DC power to the power conversion module 240.

While FIG. 2 shows a single AC-DC converter 225, it is appreciated that in other embodiments the power system 200 can include two or more AC-DC converters. In embodiments where there are two or more AC-DC converters, each of the AC-DC converters can be connected to the utility power 220 to provide additional power capacity to the power system 200. In some embodiments, each of the AC-DC converters can provide different amounts of power. In some embodiments, each of the AC-DC converters can provide the same amount of power.

In some embodiments, the utility power 220 can be connected directly to the compressor 255 and provide power to drive the compressor 255 thereby bypassing the inverter 250. In some embodiments, the inverter 250 can be used as an AC-DC converter and convert power received from the utility power 220 into DC power that can be provided by the inverter 250 to the load DC bus 202.

In some embodiments, the compressor 255 can be a variable speed compressor. In other embodiments, the compressor 255 can be a fixed speed (e.g., two-speed) compressor. Also, in some embodiments, the heater 275 can be configured to receive power from the inverter 250. While the compressor 255 shown in FIG. 2 is powered by AC power, it will be appreciated that in other embodiments the compressor 255 can be powered by DC power or mechanical power. Further, in some embodiments, the prime mover 210 can be directly connected (not shown) to the compressor 255 to provide mechanical power to the compressor 255.

When the compressor 255 and/or the heater 275 are powered directly by the utility power 220, the compressor 255 and/or the heater 275 can be turned on and off (e.g., operate in a start/stop mode) in order to control the amount of cooling provided by the compressor 255 and/or the amount of heating provided by the heater 275.

The controller 260 is configured to monitor and control operation of the transport climate control system. In particular, the controller 260 can control operation of the compressor 255, the heater 275, the one or more condenser fans 270, the one or more evaporator blowers 265 and any other components of the vehicle powered transport climate control system. In some embodiments, the controller 260 can monitor the amount of power drawn by the components of the transport climate control load network 212. The controller 260 can also be configured to control the power system 200. The power system 200 can also include one or more sensors (not shown) that are configured to measure one or more power parameters (e.g., voltage, current, etc.) throughout the power system 200 and communicate power parameter data to the controller 260. As shown in FIG. 2, the controller 260 can communicate with all of the components of the transport power system 200 via a communication link.

Figure 3:
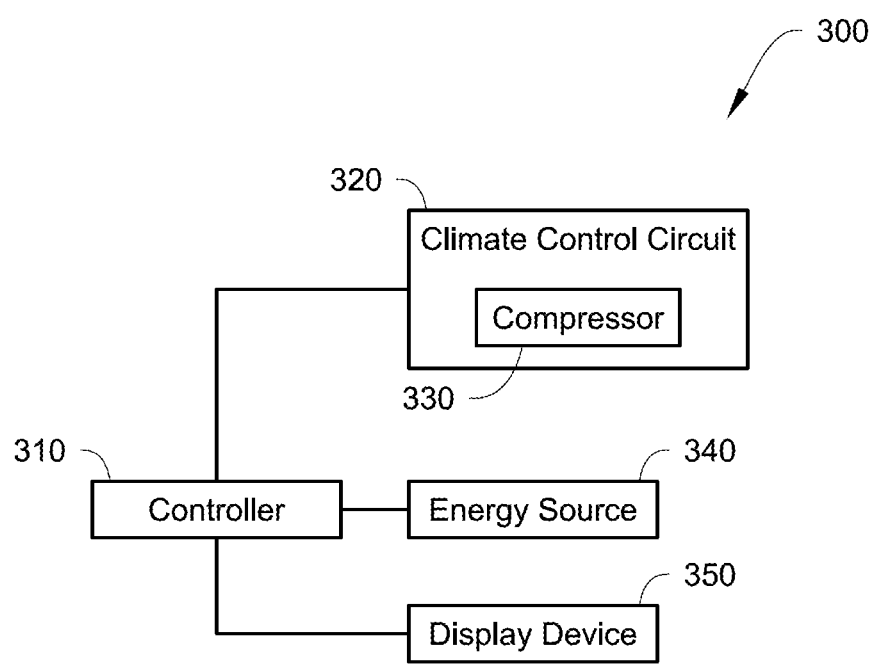
FIG. 3 is a block diagram schematic of a control system for providing feedback for a transport climate control system, according to one embodiment.

FIG. 3 is a block diagram schematic of a control system 300 for providing feedback for a transport climate control system, according to one embodiment.

The control system 300 includes a controller 310. In some embodiments, the controller 310 includes, for example, the controller 260 of FIG. 2. In some embodiments, the controller 310 can be separate from the controller 260 of FIG. 2 and can communicate with the controller 260 of FIG. 2. The processor can be located in, for example, a computer, a server, a mobile device, a cloud, etc.

The control system 300 also includes a climate control circuit 320. The climate control circuit 320 is controlled by the controller 310. The climate control circuit 320 can be, for example, the transport climate control load network 212 of FIG. 2. The climate control circuit 320 includes a compressor 330. It will be appreciated that the climate control circuit 320 can include other components, such as fans, valves (such as throttling valve, electronic expansion valve, etc.), etc.

The control system 300 further includes an energy source 340. The energy source 340 can be, for example, the prime mover power network 204 and/or the auxiliary power network 206 of FIG. 2. The energy source 340 is controlled by the controller 310.

Also the control system 300 includes at least one display device 350. The display device 350 is controlled by the controller 310. The display device 350 can be, for example, a controller HMI, a display for a telematics unit, a display for a mobile application, a webpage, etc.

Figure 4:
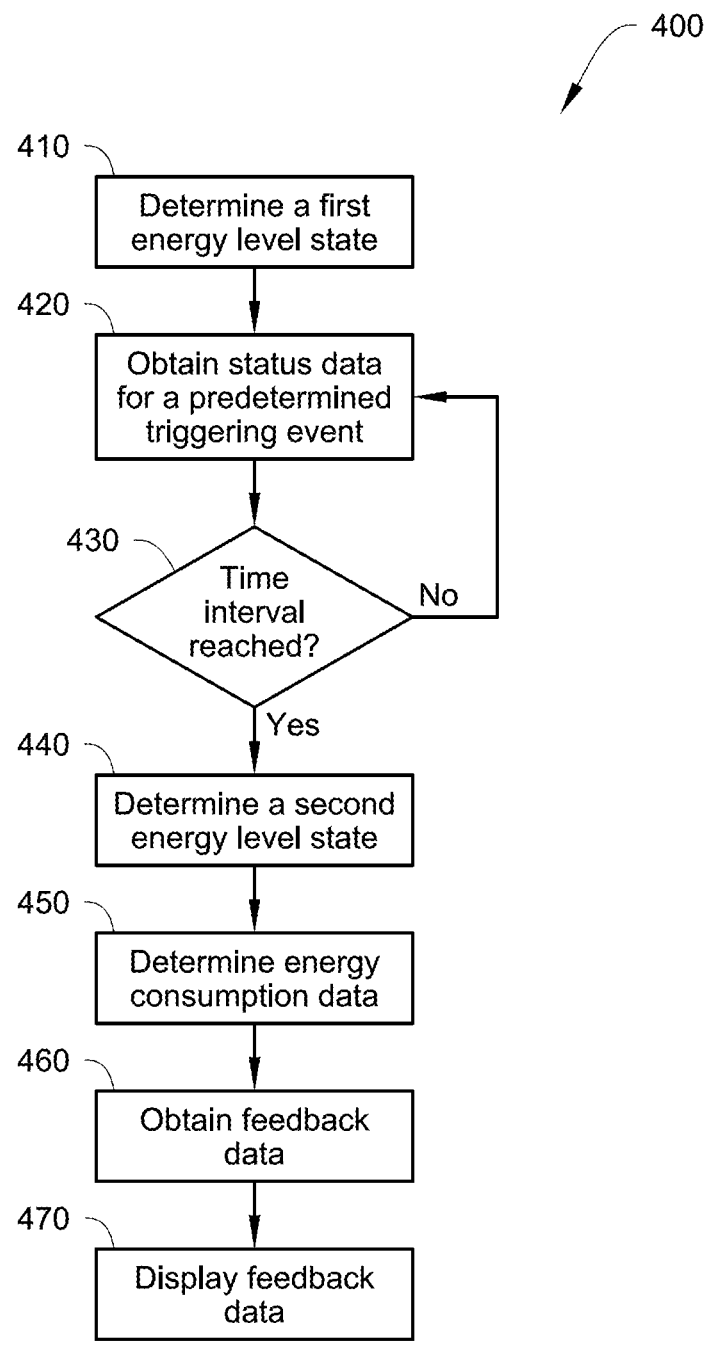
FIG. 4 is a flow chart illustrating a method for providing feedback for a transport climate control system, according to one embodiment.

FIG. 4 is a flow chart illustrating a method 400 for providing feedback for a transport climate control system, according to one embodiment.

As shown in FIG. 4, the method begins at 410 whereby a controller (e.g., the controller 310 of FIG. 3) is configured to determine a first energy level state of an energy source (e.g., the energy source 340 of FIG. 3) at a predetermined time (e.g., before the start of the trip). The first energy level state can be capable of providing power to the transport climate control system (including the climate control circuit 32 shown in FIG. 3). In one embodiment, the first energy level state can be determined by, for example, obtaining a state of charge of an energy storage device (e.g., battery), via, e.g., a power meter. The controller can determine the first energy level state based on the state of charge of the energy storage device. The first energy level state can be indicative of energy available for the transport climate control system. The method proceeds to 420.

At 420, the controller is configured to obtain status data when a predetermined triggering event occurs. It will be appreciated that a transport unit includes a climate controlled space. At least a door (e.g., the compartment door or the cabin door) is provided to the climate controlled space. In one embodiment, the predetermined triggering event can be, for example, the ambient temperature, the temperature and/or humidity within the climate controlled space, the climate control (e.g., refrigerating) set point, door opening event, door closing event, location of the transport unit, current and/or projected weather and/or traffic conditions, etc. It will be appreciated that when the predetermined triggering event refers to a temperature (e.g., the climate controlled space temperature and/or the ambient temperature) or humidity (e.g., the climate controlled space humidity level and/or the ambient humidity level), it means that the temperature reaches at or drops below a predetermined temperature (or humidity level).

It will be appreciated that the predetermined triggering event can be obtained from, e.g. a sensor (e.g., temperature sensor, door opening/closing sensor), a meter, a GPS (Global Positioning System), etc. It will also be appreciated that the sensor or meter can be on-board (within the transport unit), or can require a connection to a remote service/device. The status data can be, for example, how many times (i.e., the number) the predetermined triggering event occurs (e.g., how many times the door is opened), and/or how long (e.g., the duration) each time the predetermined triggering event occurs (e.g., how long each time the door is opened). The method proceeds to 430.

At 430, the controller is configured to start a timer. With a timer, when the predetermined triggering event occurs (e.g., door is opened for door opening event) or ends (e.g., door is closed for door opening event), the controller can obtain a timestamp for each occurrence and determine the number and the duration of the occurrences (total or for each of the occurrences) of the predetermined triggering event.

When a predetermined time interval is not reached (e.g., a trip has not ended or a predetermined time interval desired by the user has not been met), the method proceeds back to 420. When the predetermined time interval is reached (e.g., a trip ends or at a predetermined time interval desired by the user), the method proceeds to 440.

At 440, the controller is configured to determine a second energy level state of the energy source. The second energy level state can be capable of providing power to the transport climate control system. It will be appreciated that in one embodiment, the second energy level state may indicate that the power from the energy source may not be enough to provide power to the transport climate control system, and a warning may be issued by the controller. In one embodiment, the second energy level state can be determined by, for example, obtaining a state of charge of an energy storage device (e.g., battery), via, e.g., a power meter. The controller can determine the second energy level state based on the state of charge of the energy storage device. The second energy level state can be indicative of energy available for the transport climate control system. The method proceeds to 450.

At 450, the controller is configured to determine energy consumption data of the energy source based on the first energy level state and the second energy level state. It will be appreciated that in one embodiment, the energy consumption data can be the first energy level state subtracting the second energy level state. In another embodiment, the energy consumption data can be the energy usage over the course of the trip. For example, the energy consumption data can be a plot of the battery state of charge (or diesel fuel level, etc.) versus time over the course of the trip. It will be appreciated that based on past energy usage and/or other factors (e.g., simulation data or predicted data), the amount of energy remaining at the time of the report/feedback can be projected and indicated. The method proceeds to 460.

At 460, the controller is configured to obtain feedback data. The feedback data can be obtained by, e.g., combining the status data and the energy consumption data.

The feedback data can include, for example, a low energy remaining notification and/or warning displayed in the transport unit or vehicle (e.g. the remaining energy might not be sufficient to complete the current trip based on the predicted energy usage data), unusually long or frequent predetermined triggering event (such as door opening events), unexpected changes in the box temperature (e.g., the temperature of the climate controlled space) that is indicative of issues with loading/unloading the climate controlled space with cargo or issues (e.g., mal-function or failure) with the components of the transport climate control system or transport unit, etc. It will be appreciated that a malfunction or failure with the components can include, e.g., valve failures (e.g. valves sticking open or leaking), motors running with higher resistance windings or failing bearings in a condition that would consume more energy trending towards failure but still allow for system operation, wiring connections that can develop higher resistance or intermittent operation, etc.

It will be appreciated that the feedback data can also include trip planning information. For example, the feedback data can include a comparison between the number of expected stops and the actual number and/or duration of predetermined triggering event (such as door opening events) to detect unexpected behavior. For example, in the trip planning information, the transport unit can be expected to stop at a certain number of locations to deliver cargo to the customer. At each stop, the door to the climate controlled space is expected to open once to unload the cargo. Each time or at each stop, the door can be expected to open, for example, for a certain predetermined duration (e.g., about ten minutes) for unloading. If the actual number and/or duration of predetermined triggering event (such as door opening events) compared with the number of expected stops exceeds a predetermined threshold (e.g., more than two door openings at each stop, or each time the door is open longer than the predetermined duration, etc.), the controller can determine that an unexpected behavior has occurred, and the feedback data can include the unexpected behavior.

It will also be appreciated that the feedback data can include a comparison (e.g., by the controller) between measured energy use (e.g., energy consumption) and the predictions of expected energy use over the trip. Simulation and testing can predict expected energy (power) consumption over the course of a defined trip, with given ambient conditions and predetermined triggering event (such as expected door opening behavior). If the measured energy use is higher than the predicted energy use, the controller can be configured to diagnose the root cause. For example, the feedback data can include one or more predictions of the impact of an expected predetermined triggering event (e.g., expected door opening(s) and/or other events) on overall energy use. The feedback data can include a plot of actual energy use and a plot of predicted energy use (including predicted impact of the expected predetermined triggering event).

It will be appreciated that the controller can be configured to diagnose other unexpected events based on the expected energy use, and the feedback data can include such unexpected events. For example, based on expected energy use, the controller can be configured to detect if the user has started the trip without first fully pre-cooling the climate controlled space (e.g., refrigerated space). The controller can notify the user (e.g., via the display device) when such an unexpected event occurs. Another example, based on expected energy use, the controller can be configured to detect whether warm or unconditioned cargo is added to the climate controlled space during a stop by, for example, monitoring a door opening recovery (e.g., after the door is closed, monitoring the recovery of the current temperature and/or humidity of the climate controlled space back to the desired temperature and/or humidity of the climate controlled space before the door is opened) and comparing the door opening recovery against a predicted door opening recovery model where the cargo is fully pre-cooled.

It will also be appreciated that the controller can be configured to differentiate different power draws on the system. For example, the controller can be configured to differentiate loads from the transport climate control system and other loads (e.g. lift gates, etc.) that may be powered by the same energy source. In such case, the feedback data can include the power draw due to the other loads including those other loads which are larger than expected or which may have adverse impact on the ability to maintain climate conditions within the climate controlled space during the duration of a trip.

It will also be appreciated that the feedback data can include GPS or other tracking data (e.g., location information). For example, the controller can be configured to use the GPS or other tracking data to create a map of the route used in the trip for the actual performance of the route and/or the predicted performance of the route. As such, the feedback data can include details on the actual versus predicted performance (e.g., power usage) of the route, influence of traffic conditions on the performance of the route, etc.

It will be appreciated that the feedback data can include diagnostic information including one or more recommendations on how to preserve energy for the remainder of a trip. For example, based on expected energy use, the controller can be configured to determine that the energy available for the transport climate control system might be insufficient to complete a planned route. The controller can be configured to provide a recommendation and/or implement a power saving mode. For example, the controller can be configured to relax the temperature control limits slightly (e.g., by changing (increasing or decreasing) the desired setpoint temperatures within a predetermined desired setpoint temperature range) to increase the duration of the energy supply without spoiling or damaging any cargo stored in the climate controlled space. The controller can also be configured to provide a post-trip analysis showing changes that could have been made to reduce power consumption. The feedback data can include such post-trip analysis.

It will also be appreciated that the feedback data can include feedback on driver/operator behavior, either to the driver/operator or to the carrier company, via the display device. Examples of driver/operator behavior include, for example, door opening behavior, set point (e.g., temperature set point) adjustments, time spent at individual stops, route deviations, etc.

It will be appreciated that the feedback data can be in the form of a driver/operator report card, text message (e.g., SMS message), or web-based document, etc. The feedback data can include driver and/or route performance (e.g., power consumption) including events or behaviors that can influence the driver and/or route performance. The feedback data can be customized for individual drivers/operators or specific routes or destinations.

The method proceeds to 470. At 470, a display device is configured to display the feedback data. The display device can be the display device 350 of FIG. 3. In addition, it will be appreciated that in one embodiment, the display device can be a device (e.g., timer, flash lights, etc.) on the transport unit (e.g., on an external wall or door at a location that is visible to the operator who is loading or unloading the cargo).

In one embodiment, the feedback data can include energy (e.g., battery, fuel, or other energy) consumption at individual stops or over the course of a trip; energy remaining at the end of the trip (e.g., battery state of charge, fuel level, or other power source energy level); state of health of the power source (e.g., battery) or other equipment; the number and the duration of predetermined triggering event (e.g., door opening event); unexpected events (e.g., extra door openings, door openings longer than expected, unexpected defrosts, etc.); the amount of energy consumed during predetermined triggering event (e.g., door opening event) and subsequent temperature recovery; the amount of energy consumed during regular temperature maintenance (e.g. between stops); the amount of energy consumed by sources other than the climate control system; alarms (e.g., for unexpected events), power saver usage, and/or other equipment diagnostics; comparisons of measured energy use versus predictions of expected energy use (e.g. at the start of the trip; the comparisons include air/ambient or product/cargo temperatures in deviation versus a desired setpoint, which can indicate a hot load/cargo or a load/cargo not pre-cooled to the desired transport climate setpoint; it will be appreciated that hot loads/cargo can consume more energy than the prediction would indicate); suggestions on controller adjustments that can have resulted in lower energy consumption, better temperature control, etc.; warnings (e.g., in case of potential to run out of stored energy prior to the projected end of the trip); impact of external factors (e.g., weather, traffic conditions, etc.) on overall route performance; prognostics on the performance of a given route, intervention in case of unexpected energy depletion, route optimization; and/or feedback on driver/operator behavior and/or the resulting impact on route performance; etc.

Figure 5:
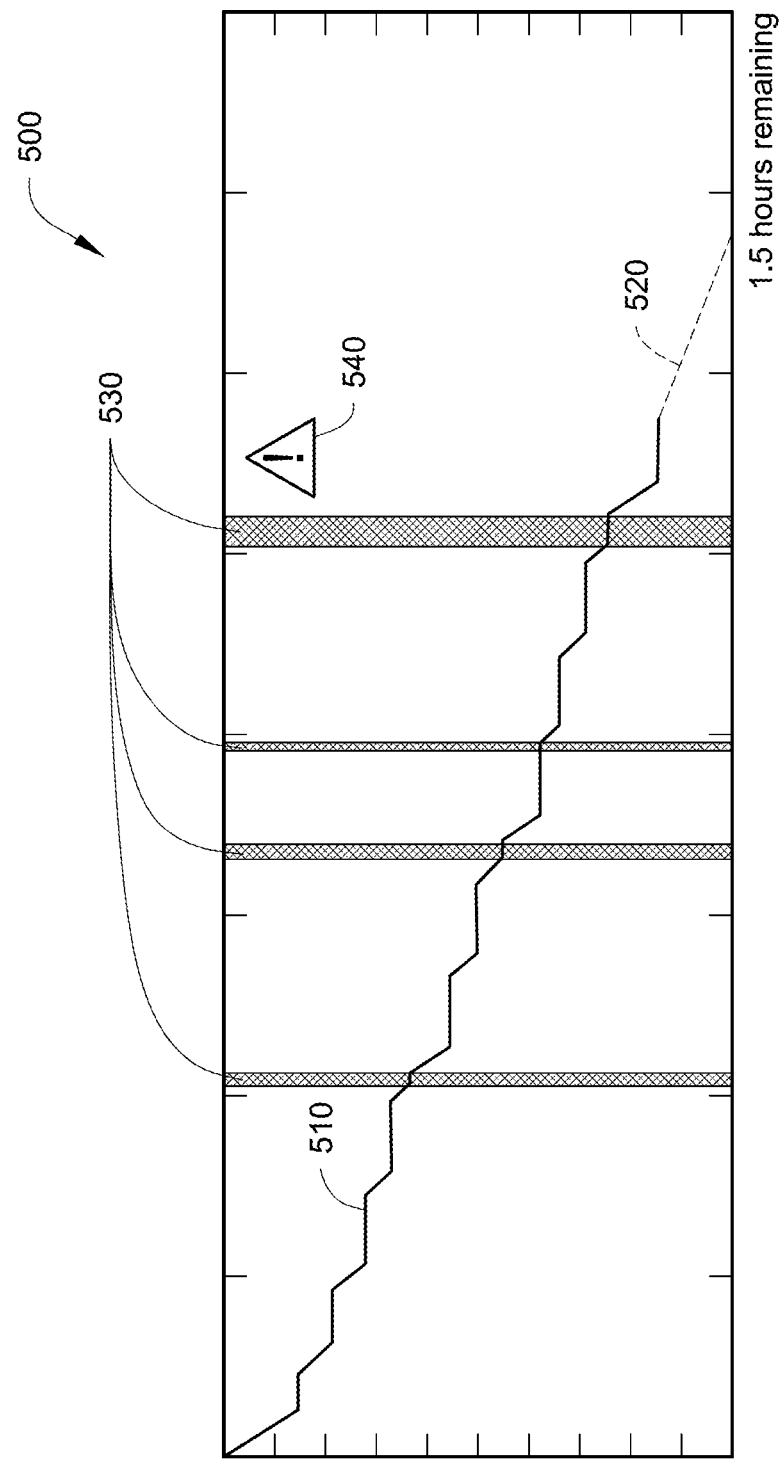
FIG. 5 illustrates an example of feedback data displayed in a display device, according to one embodiment.

FIG. 5 illustrates an example of feedback data 500 displayed in a display device, according to one embodiment. The display device can be the display device 350 of FIG. 3.

As shown in FIG. 5, post-trip feedback data 500 is displayed. The feedback data 500 includes energy usage over the course of a trip. As shown in FIG. 5, the energy remaining 510 (e.g., battery state of charge, diesel fuel level, etc.) is plotted versus time over the course of the current trip (indicating energy usage history). The vertical coordinate presents the amount of energy remaining. The horizontal coordinate presents the time. The feedback data 500 also includes a predicted energy remaining expected time 520, indicating how much time the energy remaining can support to run the system. The energy remaining expected time 520 can be obtained, by the controller, based on past energy usage and/or other factors. The feedback data 500 further includes the timing and duration of the predetermined triggering event (e.g., door opening event) 530. It will be appreciated that in FIG. 5, during the predetermined triggering event, the energy remaining 510 is flat, which indicates that the transport climate control system does not need to run. After the predetermined triggering event, the climate control system may be required to run for temperature and/or humidity recovery. As such, the energy remaining 510 drops. Also the feedback data 500 include notifications 540 to indicate potential issues with the trip. The notifications 540 can indicate low energy remaining in the transport unit (e.g. energy might be insufficient to maintain climate conditions within the climate controlled space during the duration of the current trip); an unusually long or frequent predetermined triggering event (e.g., door opening event); an unexpected change in the climate controlled space temperature which can indicate issues with loading/unloading the climate controlled space with cargo or issues (e.g., mal-function or failure) with the components of the transport climate control system or the transport unit; etc.

It will be appreciated that additional details can be displayed about route performance, to the end user for the purpose of improving their future route planning process. For example, stops which are close to each other may be visited in different orders. The optimal order can be a function of factors that include local traffic, quantity of goods to deliver, proximity to refueling/charging points, etc. It will be appreciated that feedback data can include route performance data and can be provided to a user (such as a driver).

It will also be appreciated that the users (e.g., drivers, operators) can be rewarded based on their route performance. For example, the system can, through a mobile app, can reward the user by, for example, providing free shower(s) at the truck stop, free meals, or other incentive based programs. It will further be appreciated that the users (e.g., drivers, operators) can be coached based on their route performance. For example, the system can, through a mobile app, coach the user by, for example, providing the user hints, message, or trainings to help the user learn how to better preserve the energy consumption over a trip.

Aspects:

It is appreciated that any of aspects 1-7 and 8-14 can be combined.

Aspect 1. A method for providing feedback for a transport climate control system, the transport climate control system providing climate control to a climate controlled space of a transport unit, the method comprising:
   determining, by a controller, a first energy level state capable of providing power to the transport climate control system;
   obtaining, by the controller, status data when a predetermined triggering event occurs;
   determining, by the controller, a second energy level state capable of providing power to the transport climate control system after a predetermined time interval;
   determining energy consumption data based on the first energy level state and the second energy level state;
   combining the status data and the energy consumption data to obtain feedback data; and
   displaying, via a display device, the feedback data.

Aspect 2. The method of aspect 1, wherein determining the first energy level state comprises:
   obtaining a state of charge of an energy storage device.

Aspect 3. The method of aspect 1 or aspect 2, wherein the predetermined triggering event includes at least one of a door opening event and a door closing event for a door to the climate controlled space.

Aspect 4. The method of any one of aspects 1-3, further comprising:
   starting a timer;
   obtaining a timestamp when the predetermined triggering event occurs; and
   determining a number and a duration of the occurrence of the predetermined triggering event,
   wherein the status data includes the number and the duration of the occurrence of the predetermined triggering event.

Aspect 5. The method of any one of aspects 1-4, further comprising:
   comparing the energy consumption data for a route and predicted energy consumption data for the route, and displaying the comparison.

Aspect 6. The method of any one of aspects 1-5, wherein the feedback data includes energy usage over a course of a trip of the transport unit.

Aspect 7. The method of any one of aspects 1-6, further comprising:
   the controller providing a post-trip analysis of the transport unit,
   wherein the feedback data includes the post-trip analysis.

Aspect 8. A transport climate control system for use in a vehicle, the system comprising:
   a climate control circuit including a compressor configured to provide climate control to a climate controlled space of a transport unit;
   a display device; and
   a controller connected to the display device,
   wherein the controller is configured to determine a first energy level state capable of providing power to the climate control circuit,
   the controller is configured to obtain status data when a predetermined triggering event occurs,
   the controller is configured to determine a second energy level state capable of providing power to the climate control circuit after a predetermined time interval,
   the controller is configured to determine energy consumption data based on the first energy level state and the second energy level state;

the controller is configured to combine the status data and the energy consumption data to obtain feedback data; and the display device is configured to display the feedback data.

Aspect 9. The system of aspect 8, further comprising:
a power meter configured to determine a state of charge of an energy storage device,
wherein the controller is configured to determine the first energy level state based on the state of charge of the energy storage device.

Aspect 10. The system of aspect 8 or aspect 9, wherein the predetermined triggering event includes at least one of a door opening event and a door closing event for a door to the climate controlled space.

Aspect 11. The system of any one of aspects 8-10, further comprising:
a timer configured to obtain a timestamp when the predetermined triggering event occurs,
wherein the controller is configured to determine a number and a duration of the occurrence of the predetermined triggering event, and
wherein the status data includes the number and the duration of the occurrence of the predetermined triggering event.

Aspect 12. The system of any one of aspects 8-11, wherein the controller is configured to compare between the energy consumption data for a route and predicted energy consumption data for the route, and the display device is configured to display the comparison.

Aspect 13. The system of any one of aspects 8-12, wherein the feedback data include energy usage over a course of a trip of the transport unit.

Aspect 14. The system of any one of aspects 8-13, wherein the controller is configured to provide a post-trip analysis of the transport unit, and the feedback data include the post-trip analysis.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:

1. A method for providing feedback for a transport climate control system, the transport climate control system providing climate control to a climate controlled space of a transport unit, the method comprising:
   determining, by a controller, before starting a route, a first energy level state of an energy source capable of providing power to the transport climate control system;
   obtaining, by the controller, status data when a predetermined triggering event occurs, the status data being indicative of a number and a duration of occurrence of the predetermined triggering event;
   determining, by the controller, at an end of the route, a second energy level state of the energy source capable of providing power to the transport climate control system;
   determining energy consumption data and energy remaining data based on the first energy level state and the second energy level state;
   combining the status data and the energy consumption data to obtain feedback data, the feedback data being indicative of a performance of the route;
   displaying, via a display device, the feedback data;
   predicting a duration of time based on the feedback data; and
   controlling the transport climate control system based on the feedback data and the energy remaining data.

2. The method of claim 1, wherein determining the first energy level state comprises:
   obtaining a state of charge of an energy storage device.

3. The method of claim 1, wherein the predetermined triggering event includes at least one of a door opening event and a door closing event for a door to the climate controlled space.

4. The method of claim 1, further comprising:
   starting a timer;
   obtaining a timestamp when the predetermined triggering event occurs; and
   determining the number and the duration of the occurrence of the predetermined triggering event,
   wherein the status data includes the number and the duration of the occurrence of the predetermined triggering event.

5. The method of claim 1, further comprising:
   comparing the energy consumption data for the route and predicted energy consumption data for the route, and
   displaying the comparison.

6. The method of claim 1, wherein the feedback data includes energy usage over a course of the route of the transport unit.

7. The method of claim 1, further comprising:
   the controller providing a post-trip analysis of the transport unit,
   wherein the feedback data includes the post-trip analysis.

8. A transport climate control system for use in a vehicle, the system comprising:
   a climate control circuit including a compressor configured to provide climate control to a climate controlled space of a transport unit;
   a display device; and
   a controller connected to the display device,
   wherein the controller is configured to determine, before starting a route, a first energy level state of an energy source capable of providing power to the climate control circuit,
   the controller is configured to obtain status data when a predetermined triggering event occurs, the status data being indicative of a number and a duration of occurrence of the predetermined triggering event,
   the controller is configured to determine, at an end of the route, a second energy level state of the energy source capable of providing power to the climate control circuit,
   the controller is configured to determine energy consumption data and energy remaining data based on the first energy level state and the second energy level state;

the controller is configured to combine the status data and the energy consumption data to obtain feedback data, the feedback data being indicative of a performance of the route;

the display device is configured to display the feedback data; and the controller is configured to predict a duration of time based on the feedback data and control the transport climate control system based on the feedback data and the energy remaining data.

9. The system of claim 8, further comprising:

a power meter configured to determine a state of charge of an energy storage device, wherein the controller is configured to determine the first energy level state based on the state of charge of the energy storage device.

10. The system of claim 8, wherein the predetermined triggering event includes at least one of a door opening event and a door closing event for a door to the climate controlled space.

11. The system of claim 8, further comprising:

a timer configured to obtain a timestamp when the predetermined triggering event occurs, wherein the controller is configured to determine the number and the duration of the occurrence of the predetermined triggering event, and wherein the status data includes the number and the duration of the occurrence of the predetermined triggering event.

12. The system of claim 8, wherein the controller is configured to compare between the energy consumption data for the route and predicted energy consumption data for the route, and the display device is configured to display the comparison.

13. The system of claim 8, wherein the feedback data include energy usage over a course of the route of the transport unit.

14. The system of claim 8, wherein the controller is configured to provide a post-trip analysis of the transport unit, and the feedback data include the post-trip analysis.

15. The method of claim 1, wherein the first energy level state is indicative of energy available for the transport climate control system before starting the route, the second energy level state is indicative of energy available for the transport climate control system at the end of the route, and the feedback data includes one or more of energy consumption over a duration of the route, door opening events, and an impact on a performance of a remaining route.

16. The method of claim 1, wherein the feedback data is configured to provide one or more of prognostics on a quality of the route, a need for intervention in case the energy source is depleted, and route optimization.

* * * * *